United States Patent
Yamazaki

(10) Patent No.: US 7,625,493 B2
(45) Date of Patent: Dec. 1, 2009

(54) METHOD FOR MANUFACTURING DISPLAY DEVICE

(75) Inventor: Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/772,419

(22) Filed: Feb. 6, 2004

(65) Prior Publication Data

US 2005/0064091 A1    Mar. 24, 2005

(30) Foreign Application Priority Data

Feb. 6, 2003    (JP)    ............... 2003-029956

(51) Int. Cl.
  *B05D 5/12*    (2006.01)
(52) U.S. Cl. ............... 216/4; 216/17; 216/39; 216/42; 216/67; 427/58; 427/282; 257/E21.174; 257/E21.311; 257/E21.314; 257/E21.414; 257/E21.582
(58) Field of Classification Search ........... None
  See application file for complete search history.

(56) References Cited

U.S. PATENT DOCUMENTS

| | | |
|---|---|---|
| 4,328,257 A | 5/1982 | Muehlberger et al. |
| 5,429,994 A | 7/1995 | Ishikawa |
| 5,483,082 A | 1/1996 | Takizawa et al. |
| 5,549,780 A | 8/1996 | Koinuma et al. |
| 5,563,095 A | 10/1996 | Frey |
| 5,580,796 A | 12/1996 | Takizawa et al. |
| 5,679,167 A | 10/1997 | Muehlberger |
| 5,824,361 A | 10/1998 | Asanuma |
| 6,019,850 A | 2/2000 | Frey |
| 6,051,150 A | 4/2000 | Miyakawa |
| 6,118,502 A | 9/2000 | Yamazaki et al. |

(Continued)

FOREIGN PATENT DOCUMENTS

EP    0 930 641 A2    7/1999

(Continued)

OTHER PUBLICATIONS

International Search Report (Application No. PCT/JP2004/000895) and Written Opinion dated Apr. 27, 2004 with partial translation of Written Opinion.

(Continued)

*Primary Examiner*—Allan Olsen
(74) *Attorney, Agent, or Firm*—Nixon Peabody LLP; Jeffrey L. Costellia

(57) ABSTRACT

In order to achieve low cost of manufacture of a display device by reducing the use of primary material used in a manufacturing process of a display device and saving labor taken for a vacuum process, according to the invention, liquid droplets containing conductive particles are ejected on a film being processed by using a first liquid droplet ejecting apparatus having a liquid droplet ejecting head provided with a plurality of liquid droplet ejecting orifices, thereby a conductive film is formed. After that, a resist pattern is locally formed on the conductive film by using a second liquid droplet ejecting apparatus having a liquid droplet ejecting head provided with a plurality of liquid droplet ejecting orifices. The conductive film is etched with the resist pattern as a mask to form a wiring.

16 Claims, 18 Drawing Sheets

U.S. PATENT DOCUMENTS

| | | |
|---|---|---|
| 6,203,619 B1 | 3/2001 | McMillan |
| 6,228,465 B1 | 5/2001 | Takiguchi et al. |
| 6,231,917 B1 | 5/2001 | Ito et al. |
| 6,293,222 B1 | 9/2001 | Paquet |
| 6,416,583 B1 | 7/2002 | Kitano et al. |
| 6,424,091 B1 | 7/2002 | Sawada et al. |
| 6,429,400 B1 | 8/2002 | Sawada et al. |
| 6,599,582 B2 | 7/2003 | Kiguchi et al. |
| 6,627,263 B2 | 9/2003 | Kitano et al. |
| 6,660,545 B2 | 12/2003 | Furusawa |
| 6,767,473 B2 | 7/2004 | Fujita et al. |
| 6,776,880 B1 | 8/2004 | Yamazaki |
| 6,782,928 B2 | 8/2004 | Kweon et al. |
| 6,808,749 B2 | 10/2004 | Morii et al. |
| 6,871,943 B2 | 3/2005 | Ogawa |
| 6,877,853 B2 | 4/2005 | Kiguchi et al. |
| 6,909,477 B1 | 6/2005 | Yi et al. |
| 6,973,710 B2 | 12/2005 | Kiguchi et al. |
| 7,114,802 B2 | 10/2006 | Kiguchi et al. |
| 7,115,434 B2 | 10/2006 | Yamazaki et al. |
| 7,176,069 B2 | 2/2007 | Yamazaki et al. |
| 7,189,654 B2 | 3/2007 | Yamazaki et al. |
| 2001/0002331 A1 | 5/2001 | Miyata |
| 2001/0003601 A1 | 6/2001 | Ueda et al. |
| 2001/0004190 A1 | 6/2001 | Nishi et al. |
| 2001/0027013 A1 | 10/2001 | Tsutsui |
| 2002/0022364 A1 | 2/2002 | Hatta et al. |
| 2002/0067400 A1 | 6/2002 | Kawase et al. |
| 2002/0105080 A1 | 8/2002 | Speakman |
| 2002/0109143 A1 | 8/2002 | Inoue |
| 2002/0128515 A1 | 9/2002 | Ishida et al. |
| 2002/0151171 A1 | 10/2002 | Furusawa |
| 2003/0054653 A1 | 3/2003 | Yamazaki et al. |
| 2003/0059975 A1 | 3/2003 | Sirringhaus et al. |
| 2003/0059984 A1 | 3/2003 | Sirringhaus et al. |
| 2003/0059987 A1 | 3/2003 | Sirringhaus et al. |
| 2003/0060038 A1 | 3/2003 | Sirringhaus et al. |
| 2003/0132987 A1 | 7/2003 | Ogawa |
| 2004/0050685 A1 | 3/2004 | Yara et al. |
| 2004/0075396 A1 | 4/2004 | Okumura et al. |
| 2004/0224433 A1* | 11/2004 | Yamazaki et al. ............. 438/39 |
| 2004/0253896 A1 | 12/2004 | Yamazaki |
| 2004/0266073 A1 | 12/2004 | Yamazaki |
| 2005/0011752 A1 | 1/2005 | Yamazaki et al. |
| 2005/0013927 A1 | 1/2005 | Yamazaki |
| 2005/0064091 A1 | 3/2005 | Yamazaki |
| 2005/0090029 A1 | 4/2005 | Yamazaki et al. |
| 2005/0158456 A1 | 7/2005 | Kiguchi et al. |
| 2005/0167404 A1 | 8/2005 | Yamazaki |
| 2007/0167023 A1 | 7/2007 | Yamazaki et al. |
| 2007/0172972 A1 | 7/2007 | Yamazaki et al. |
| 2008/0206915 A1 | 8/2008 | Yamazaki |

FOREIGN PATENT DOCUMENTS

| | | |
|---|---|---|
| EP | 1 253 626 A2 | 10/2002 |
| EP | 1340838 A1 | 9/2003 |
| JP | 06-202153 | 7/1994 |
| JP | 07-024579 | 1/1995 |
| JP | 09-320363 | 12/1997 |
| JP | 10-062814 | 3/1998 |
| JP | 11-168042 | 6/1999 |
| JP | 11-204529 A | 7/1999 |
| JP | 11-274671 A | 10/1999 |
| JP | 11-340129 | 12/1999 |
| JP | 2000-157899 A | 6/2000 |
| JP | 2000-169977 | 6/2000 |
| JP | 2000-188251 A | 7/2000 |
| JP | 2000-328269 | 11/2000 |
| JP | 2001-068827 | 3/2001 |
| JP | 2001-093871 | 4/2001 |
| JP | 2001-179167 | 7/2001 |
| JP | 2001-209073 | 8/2001 |
| JP | 2002-066391 | 3/2002 |
| JP | 2002-096474 A | 4/2002 |
| JP | 2002-151478 | 5/2002 |
| JP | 2002-237463 | 8/2002 |
| JP | 2002-237480 | 8/2002 |
| JP | 2002-261048 A | 9/2002 |
| JP | 2002-289864 | 10/2002 |
| JP | 2002-324966 | 11/2002 |
| JP | 2002-359246 | 12/2002 |
| JP | 2002-359347 | 12/2002 |
| JP | 2003-010755 A | 1/2003 |
| JP | 2003-017413 | 1/2003 |
| JP | 2003-126760 A | 5/2003 |
| JP | 2003-192499 A | 7/2003 |
| JP | 2003-212685 A | 7/2003 |
| JP | 2003-212686 A | 7/2003 |
| JP | 2003-238286 A | 8/2003 |
| JP | 2003-311197 | 11/2003 |
| JP | 2003-347284 | 12/2003 |
| WO | WO-01-47044 | 6/2001 |
| WO | WO-02-40742 | 5/2002 |
| WO | WO-2004/070809 | 8/2004 |
| WO | WO-2004/070810 | 8/2004 |
| WO | WO-2004/070811 | 8/2004 |
| WO | WO-2004/070819 | 8/2004 |
| WO | WO-2004/070820 | 8/2004 |
| WO | WO-2004-070822 | 8/2004 |
| WO | WO-2004-070823 | 8/2004 |

OTHER PUBLICATIONS

International Search Report (Application No. PCT/JP2004/000897) and Written Opinion dated Apr. 27, 2004 with partial translation of Written Opinion.

International Search Report (Application No. PCT/JP2004/000900) and Written Opinion dated Jun. 1, 2004 with partial translation of Written Opinion.

International Search Report (Application No. PCT/JP2004/000915) and Written Opinion dated Apr. 27, 2004 with partial translation of Written Opinion.

International Search Report (Application No. PCT/JP2004/000918) and Written Opinion dated Apr. 27, 2004 with partial translation of Written Opinion.

International Search Report (Application No. PCT/JP2004/000930) and Written Opinion dated Apr. 23, 2004 with partial translation of Written Opinion.

International Search Report (Application No. PCT/JP2004/00932) and Written Opinion dated Apr. 6, 2004 with partial translation of Written Opinion.

Apr. 27, 2004 International Search Report for Application No. PCT/JP2004/000899.

Apr. 27, 2004 Partial Translation of a Written Opinion for Application No. PCT/JP2004/000899.

International Search Report (Application No. PCT/JP2004/000930) and Written Opinion dated Apr. 13, 2004 with partial translation of Written Opinion.

S. Wolf et al. "*Silicon Processing for the VLSI ERA*" vol. 1 (Process Technology), pp. 198, 408, 427, 539, 542, 535; Jan. 1, 1986.

\* cited by examiner

METHOD FOR MANUFACTURING DISPLAY DEVICE

TECHNICAL FIELD

The present invention relates to a manufacturing method of a display device represented by a liquid crystal display device (LCD).

BACKGROUND ART

Conventionally, a thin film transistor (TFT) included in a display device represented by a liquid crystal display device (LCD) and a self-luminous display device (EL: Electroluminescence) display device) has been formed by a vacuum process that the interior of a processing apparatus is in reduced pressure or in vacuum, or by a photolithography process that a mask of (photo) resist is formed by an exposure apparatus and unnecessary portions are removed by etching.

The vacuum process requires a process chamber used for depositing a film on a substrate being processed, performing etching and the like, and an exhaust means for making a vacuum state or a reduced pressure state.

The exhaust means is formed of a pump represented by a turbo molecular pump, rotary pump and the like provided externally the processing apparatus, a means for managing and controlling the pump, a pipe and a valve constituting an exhaust system by connecting the pump and a processing chamber, and the like. In order to provide this equipment, a space is required for the exhaust system externally the processing apparatus, which requires additional cost. Furthermore, equipment of an exhaust system is required to be provided to the processing apparatus itself as well. Therefore, a size of the processing apparatus is increased as compared to a processing apparatus without the exhaust system.

The photolithography process that has been used conventionally for forming a wiring of a thin film transistor and the like is performed as follows. First, a photosensitive resist (photo resist) is applied by spin coating on a conductive film formed on a substrate, thereby the resist is spread on the entire surface of the conductive film. Next, light is irradiated through a photo mask in which a pattern is formed of metal, thereby the resist is exposed. Subsequently, development and post baking are performed, thereby a resist pattern is formed according to the pattern of the photo mask. Further, with the resist formed in a pattern as a mask, a conductive film under the resist is etched. Finally, by peeling the resist pattern used as a mask, the conductive film can be etched in the pattern formed in the photo mask, thereby the conductive film that is left is used as a wiring.

DISCLOSURE OF THE INVENTION

[Problems to be Solved by the Invention]

In the vacuum process in the conventional technology, however, a volume of a process chamber is increased in accordance with the size of a substrate being larger (1.2 m×1 m) after a fifth generation. Accordingly, an exhaust system of larger scale is required in order to obtain a process chamber in vacuum or reduced pressure state, which requires more time for exhaust. Moreover, cost is increased as well such as equipment cost and maintenance cost of the exhaust system. In addition, in the case of substituting the chamber with a gas such as nitrogen, more amount of gas is required due to the increased volume of the chamber, which affects production cost. Further, as huge running cost is required such as a power source in accordance with a substrate being larger, an impact on the environment is increased.

In a process using the photolithography process in the conventional technology, for example, in a manufacturing process of a wiring, a large portion of a coating film deposited on the entire surface of a substrate (a resist, metal, a semiconductor and the like) is etched, therefore, a ratio that a wiring and the like remain on the substrate was about several to several tens %. The resist film was wasted by about 95% when forming by spin coating. That is, most of the material is thrown away, which affects the production cost as well as increases the impact on the environment. Such a tendency becomes more obvious as a size of a substrate that flows in a production line becomes larger.

[Means for Solving the Problem]

According to the invention, liquid droplets containing conductive particles are ejected on a film being processed by using a liquid droplet ejecting apparatus having a liquid droplet ejecting head provided with a plurality of liquid droplet ejecting nozzles, thereby a conductive film is formed locally to form a wiring. Accordingly, a wiring can be formed without using a photolithography process, thus the process can be simplified.

Further, the invention is characterized in that a resist pattern is locally formed on the conductive film by using a second liquid droplet ejecting apparatus having a liquid droplet ejecting head provided with a plurality of liquid droplet ejecting nozzles, thus the conductive film is etched with the resist pattern as a mask to form a wiring. Accordingly, the amount of resist to be used can be considerably reduced as compared to photolithography using a spin method.

Further, the invention is characterized in that the conductive film is etched locally an atmospheric pressure or a pressure close to the atmospheric pressure by using a plasma processing apparatus including a plasma generating means provided with a pair of cylindrical electrodes or a plasma generating means provided with a plurality of pairs of cylindrical electrodes arranged linearly at. Accordingly, a vacuum processing for making an interior of a process chamber in vacuum or reduced pressure is not required, thus a burden on the exhaust system can be reduced.

Here, the pressure close to the atmospheric pressure refers to a pressure of 600 to 106000 Pa.

Moreover, a manufacturing method of a display device of the invention is characterized in that after a conductive film is formed on a substrate being processed, unnecessary portions of the conductive film are etched locally at an atmospheric pressure or a pressure close to the atmospheric pressure by using a plasma processing apparatus including a plasma generating means provided with a pair of cylindrical electrodes or a plasma generating means provided with a plurality of pairs of cylindrical electrodes arranged linearly to form a wiring. Accordingly, a wiring can be formed without using a photolithography process, thus the process can be simplified.

[Effect of the Invention]

By manufacturing a display device by using a manufacturing method of a display device of the invention, a waste of the material used for manufacturing a display device can be reduced. Therefore, manufacturing cost can be reduced. By manufacturing a display device by using a manufacturing method of a display device of the invention, simplification of the process, device and a manufacturing line of smaller scale, and a shorter time for the process can be achieved. Further, an impact on the environment can be reduced since energy can be reduced as the equipment of the exhaust system which was conventionally required can be simplified.

BEST MODE FOR CARRYING OUT THE INVENTION

Embodiment modes of the invention are described below.

Embodiment Mode 1

In this embodiment mode, a wiring pattern which is essential for a display device is formed on a glass substrate of a desired size by using a liquid droplet ejecting apparatus having a liquid droplet ejecting head provided with a plurality of liquid droplet ejecting nozzles arranged linearly and a plasma processing apparatus having a plasma generating means at an atmospheric pressure or a pressure close to the atmospheric pressure. In particular, the invention is intended to be applied to a substrate of the fifth generation or after thereof which is larger in size. Embodiment Mode 1 of the invention is hereafter described with reference to the drawings.

Figure 1A:
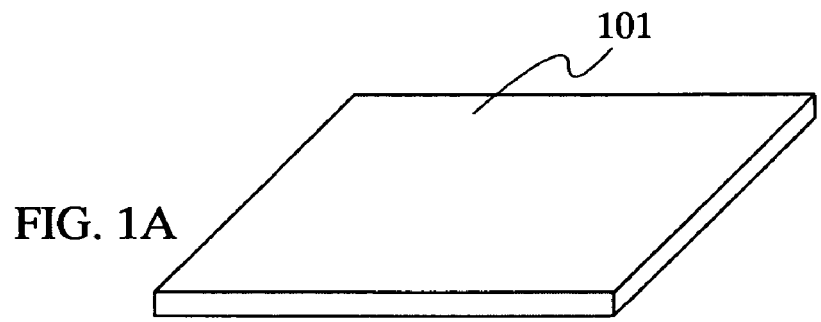
FIGS. 1A to 1D are schematic perspective views of a process according to Embodiment Mode 1 of the invention.
Figure 1B:
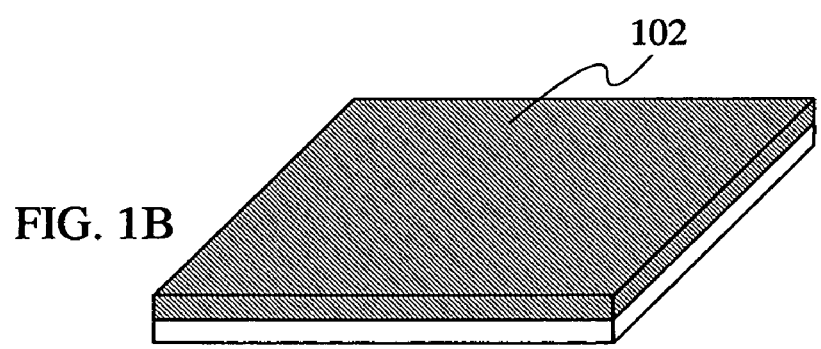

First, a conductive film 102 which is to be a wiring is deposited (FIG. 1B) on a substrate 101 being processed which is formed of various materials such as glass, quartz, a semiconductor, plastic, a plastic film, metal, glass epoxy resin, ceramic by using a known method such as sputtering or a CVD method (Chemical Vapor Deposition). As a material for the substrate 101 being processed, anything may be used as long as it can withstand the processing heat of the manufacturing process of the invention.

Figure 1C:
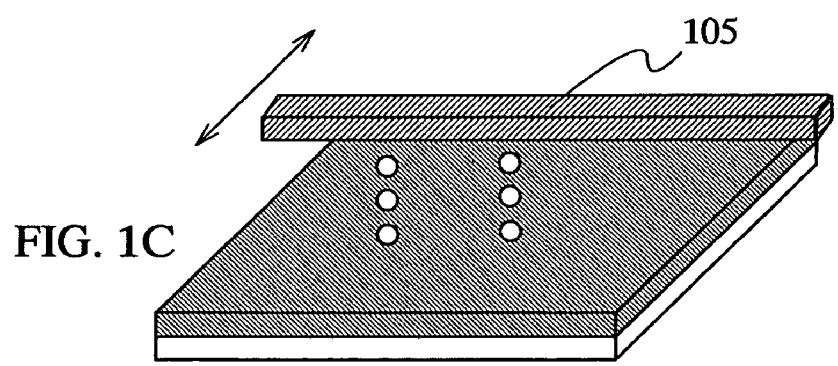
Figure 1D:
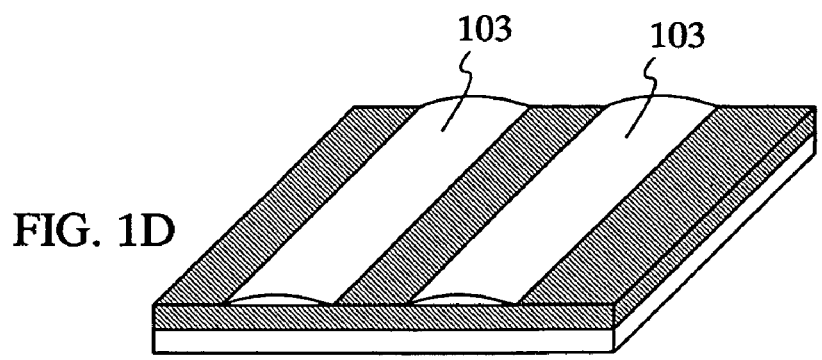

Next, a plurality of resist patterns 103 are formed (FIG. 1D) in a wiring pattern forming portion by using a liquid droplet ejecting apparatus having a liquid droplet ejecting head 105 provided with a plurality of liquid droplet ejecting nozzles arranged linearly (FIG. 1C) which is to be described later. After forming the resist patterns 103, a baking is processed. Each of the resist patterns 103 has a shape that a plurality of patterns which are formed by ejecting liquid droplets from a plurality of liquid droplet ejecting nozzles are connected. By ejecting liquid droplets at a certain time interval while scanning a liquid droplet ejecting head 105 scans in one direction, the shape of each of the resist patterns 103 is formed. Note that an arbitrary pattern, for example a T-shape pattern can be formed as well as the linear pattern as described above, by controlling so that liquid droplets are ejected continuously from only specific liquid droplet ejecting nozzles among the plurality of liquid droplet ejecting nozzles.

Figure 2A:
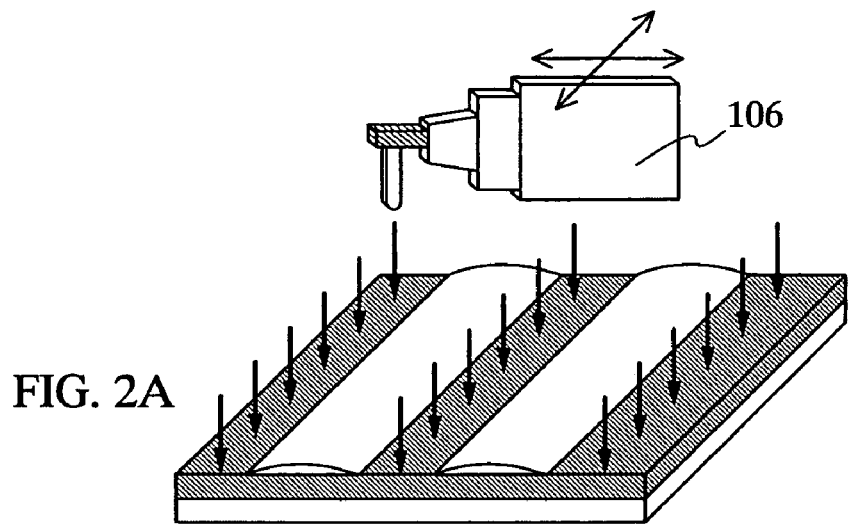
FIGS. 2A to 2D are schematic perspective views of a process according to Embodiment Mode 1 of the invention.
Figure 2B:
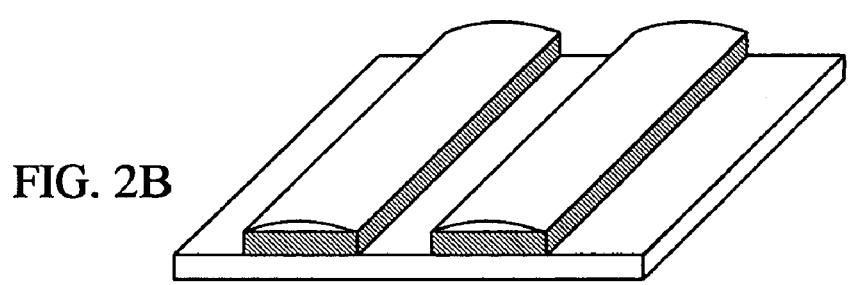
Figure 2C:
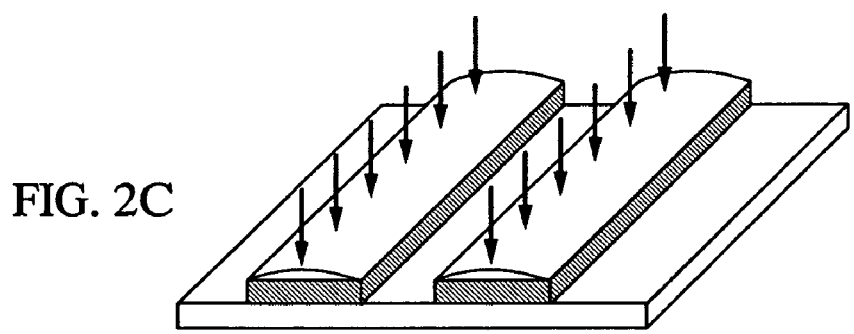
Figure 2D:
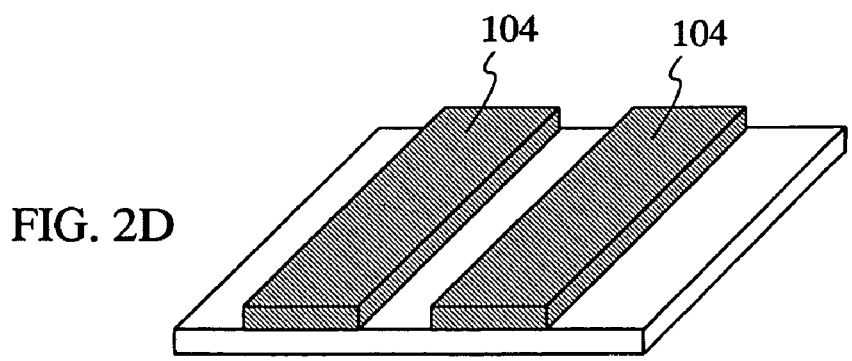

Next, the conductive film 102 is etched (FIG. 2A) by using a plasma processing apparatus having a plasma generating means 106 at an atmospheric pressure or a pressure close to the atmospheric pressure which is to be described later and the aforementioned resist patterns 103 as masks. The etching is performed by scanning the plasma generating means in one direction (or the substrate being processed in one direction). Here, a gas which reacts with the conductive film is used as an etching gas. By performing the etching process, the conductive film 102 which is not covered with the resist patterns 103 only is etched (FIG. 2B). After the etching process, the unnecessary resist patterns 103 are removed by applying ashing by using a similar aforementioned plasma processing apparatus (FIG. 2C). The scanning of the plasma generating means at the time of the ashing is performed similarly to the etching. As a result, only the conductive films formed under the resist pattern forming portions are left, thus wiring patterns 104 are formed (FIG. 2D). Note that an oxygen gas which has a high reactivity with the resist is used for ashing.

A punctiform liquid droplet ejecting apparatus having a liquid droplet ejecting head provided with punctiform liquid droplet ejecting nozzles arranged linearly, which is used for the invention is described with reference to the accompanying drawings.

Figure 3A:
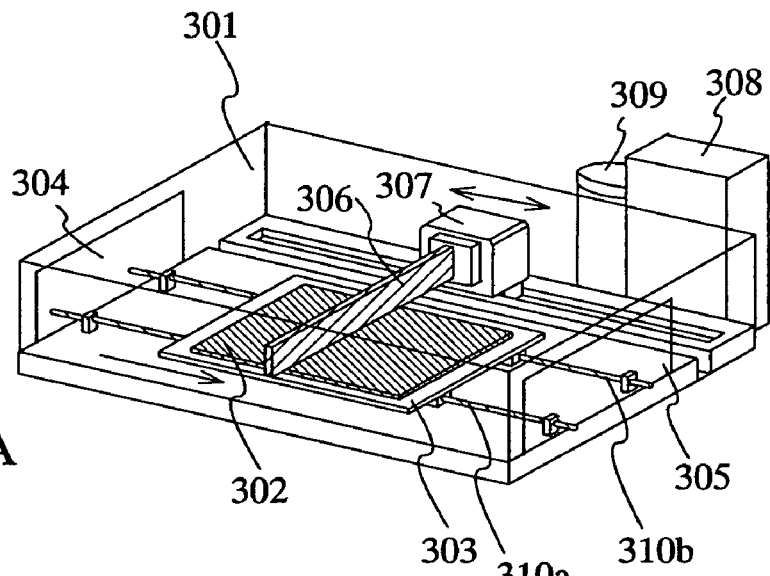
FIGS. 3A to 3C are perspective views each showing a structure of a punctiform liquid droplet ejecting apparatus.
Figure 3B:
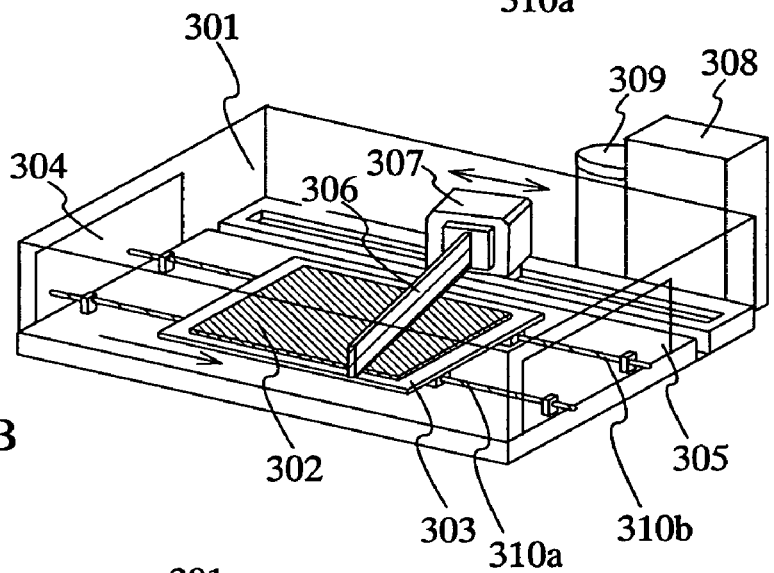
Figure 3C:
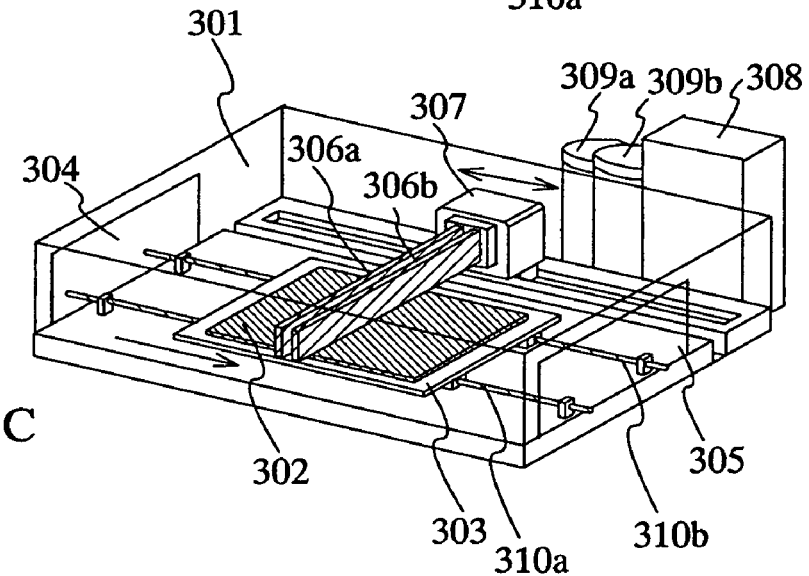

FIGS. 3A to 3C show structure examples of a linear liquid droplet ejecting apparatus of the invention. FIGS. 4 and 5A to 5C each shows a head portion provided with nozzles which is used for the linear liquid droplet ejecting apparatus.

The linear liquid droplet ejecting apparatus shown in FIG. 3A has a head 306 in the apparatus. By ejecting liquid droplets using this, a desired liquid droplet pattern is obtained on a substrate 302. In the linear liquid droplet ejecting apparatus, a glass substrate with a desired size, a resin substrate represented by a plastic substrate, or an object being processed such as a semiconductor wafer represented by silicon can be applied as the substrate 302.

In FIG. 3A, the substrate 302 is carried from a carry-in entrance 304 into a housing 301, and the substrate after the liquid droplet ejecting process is carried out from a carry-out exit 305. In the housing 301, the substrate 302 is mounted on a carrier 303 which moves on rails 310a and 310b which connect the carry-in entrance and the carry-out exit.

A head support portion 307 supports a head 306 which ejects liquid droplets and moves in parallel to the carrier 303. When the substrate 302 is carried into the housing 301, the head support portion 307 moves to a predetermined position at the same time. By moving the head 306 to an initial position at the time of carrying in the substrate or carrying out the substrate, an ejection process can be efficiently performed.

The liquid droplet ejecting process starts when the substrate 302 reaches a predetermined position where the head 306 waits by being moved by the carrier 303. The liquid droplet ejecting process is achieved by a combination of a relative movement of the head support portion 307 and the substrate 302 and a liquid droplet ejection from the head 306 supported by the head support portion. By controlling a moving rate of the substrate and the head support portion and a cycle to eject liquid droplet from the head 306, a predetermined liquid droplet pattern can be drawn on the substrate 302. In particular, as the liquid droplet ejecting process requires high precision, it is preferable to stop the movement of the carrier when ejecting liquid droplets and scan only the head support portion 307 sequentially which is highly controllable. Further, the head 306 is capable of scanning back and forth in one direction.

A material liquid is supplied from a liquid droplet supplying portion 309 provided externally the housing 301 into the housing, then supplied to a liquid chamber in the head 306 via the head support portion 307. This material liquid supply is controlled by a control means 308 externally provided to the housing 301, however, it may also be controlled by a control means incorporated in the head support portion 307 in the housing.

The movements of the carrier and the head support portion are controlled similarly by the control means 308 externally provided to the housing 301.

Although not shown in FIG. 3A, a sensor for aligning the substrate and the pattern on the substrate, a gas inlet means to the housing, an exhaust means in the housing, a means for processing the substrate by heat, a means for irradiating light to the substrate, a means for measuring various physical values such as a temperature, and a pressure, and the like may be provided as required. Moreover, these means can be controlled in block by the control means 308 externally provided to the housing 301. Further, by connecting the control means 308 to a product management system and the like by a LAN cable, a wireless LAN, an optical fiber and the like, a process can be managed together externally, thus the productivity can be improved.

Figure 4:
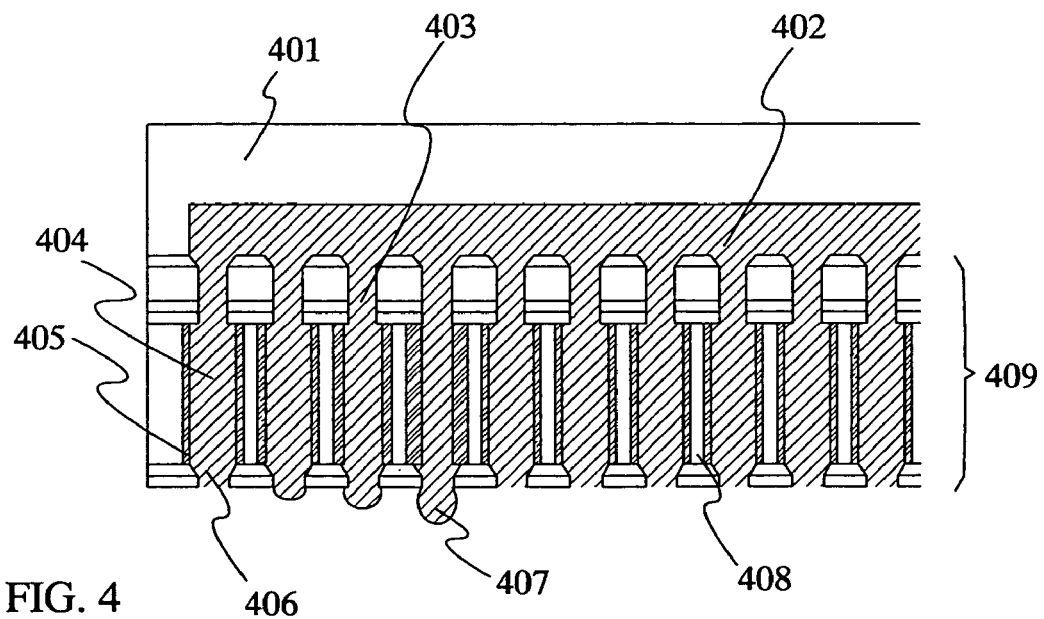
FIG. 4 is a diagram showing a structure of a liquid droplet ejecting portion of a punctiform liquid droplet ejecting apparatus of the invention.

Next, a structure of an interior of the head 306 is described. FIG. 4 is a sectional view of the head 306 shown in FIG. 3A seen from a longitudinal direction. A right side of FIG. 4 leads to the head support portion.

Liquid droplets supplied in a head 401 from outside are divided into each nozzle 409 for ejecting liquid droplets after passing through a common liquid chamber path 402. Each nozzle portion is constituted by a fluid resisting portion 403 provided for filling an appropriate amount of liquid droplets in a nozzle, a pressure chamber 404 for ejecting liquid droplets by applying a pressure, and a liquid droplet ejecting orifice 406.

A side wall of the pressure chamber 404 is provided with a piezoelectric element 405 such as titanium oxide, zirconium oxide, lead (Pb (Zr, Ti) $O_3$) each of which transforms when applied a voltage and has a piezoelectric effect. Accordingly, by applying a voltage to the piezoelectric element 405 provided in a desired nozzle, liquid droplets in the pressure chamber 404 are pushed out, thereby a liquid droplet 407 can be ejected externally. Further, as each piezoelectric element is insulated by an insulator 408 is in contact, each piezoelectric element does not electrically contact each other. Thus, an ejection of each nozzle can be controlled.

According to the invention, liquid droplet ejection is performed by what is called a piezoelectric method using piezoelectric elements, however, what is called a thermal ink-jetting method may be used as well by which liquid droplets are pushed out by generating bubbles by the heat generated by a heater. A structure in this case is that the piezoelectric element 405 is substituted by the heater.

Further, in the nozzle portion 409 for ejecting liquid droplets, wettability of a liquid droplet and the common liquid chamber path 402, the fluid resisting portion 403, the pressure chamber 404, and the liquid droplet ejecting orifice 407 is important. Therefore, a carbon film, a resin film and the like for controlling the wettability with a material may be formed in each flow path.

According to the aforementioned means, liquid droplets are continuously ejected and a pattern of a desired shape in which a pattern formed of each droplet is connected can be formed.

Figure 5A:
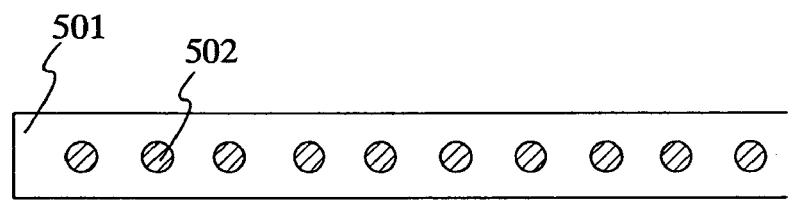
FIGS. 5A to 5C are diagrams each showing a bottom portion of a liquid droplet ejecting portion of a punctiform liquid droplet ejecting apparatus of the invention.
Figure 5B:
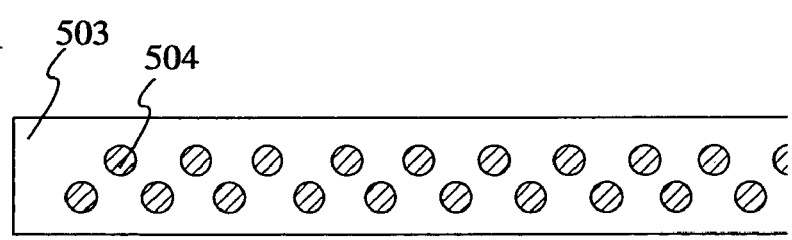
Figure 5C:
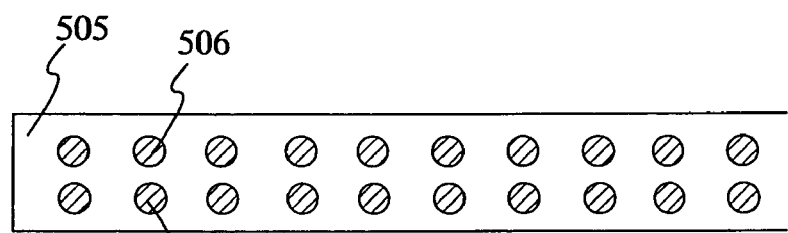

FIGS. 5A to 5C each schematically shows a bottom portion of the head shown in FIG. 4. FIG. 5A shows liquid droplet ejecting orifices 502 arranged linearly on the bottom surface of a head 501. In FIG. 5B, on the other hand, liquid droplet ejecting orifices 504 on a bottom portion 503 of a head are arranged in two lines which are offset by half a pitch. In FIG. 5C, an arrangement of two lines without an offset in pitch is employed. In the arrangement of FIG. 5C, after liquid droplets are ejected from liquid droplet ejecting orifices 506 of a first stage, similar liquid droplets are ejected from liquid droplet ejecting orifices 507 on similar positions with a time difference. Accordingly, the same liquid droplets can be accumulated thickly before the liquid droplets on the substrate which are already ejected dry or solidify. Further, when a nozzle portion of the first stage clogs due to a liquid droplet and the like, a liquid droplet ejecting orifice of a second stage can function as a spare.

Further, a linear liquid droplet ejecting apparatus shown in FIG. 3B is described which is an improved linear liquid droplet ejecting apparatus shown in FIG. 3A. This apparatus is designed so that the head 306 is placed with an angle against the substrate 302 by providing the head support portion 307 with a rotating means to rotate at an arbitrary angle θ. The angle θ may be an arbitrary angle, however, it is preferably from 0° to 45° against a direction that the substrate 302 moves in consideration of a size of the apparatus as a whole. By providing the head support portion 307 with a rotating means, a liquid droplet pattern can be drawn at a narrower pitch than a pitch of the liquid droplet ejecting orifices provided in the head.

Moreover, FIG. 3C is a linear liquid droplet ejecting apparatus of a twin-head structure in which two heads 306 of the linear liquid droplet ejecting apparatus shown in FIG. 3A are provided. This apparatus is different from FIG. 5C in which two lines of liquid droplet ejecting orifices are arranged in the head, in the respect that liquid droplets of different materials can be ejected together by the same scan. That is, while forming a pattern with a material liquid A by a head 306a, a pattern can be formed by ejecting a material liquid B by a head 306b with a slight time difference, thus a pattern can be continuously formed. Reference numerals 309a and 309b denote material liquid supply portions which stock and supply the material liquid A and the material liquid B which are used for each head. By employing this twin-head structure, a process can be simplified and efficiency can considerably be raised.

Figure 6A:
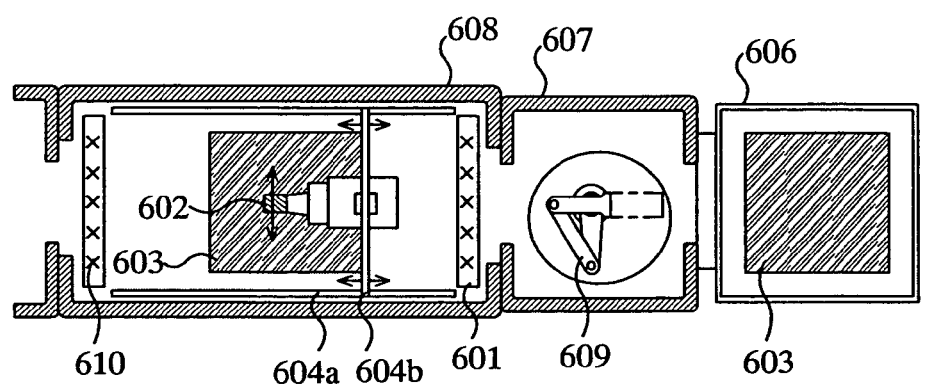
FIGS. 6A and 6B are perspective views each showing a structure of a plasma processing apparatus at an atmospheric pressure or a pressure close to the atmospheric pressure.
Figure 6B:
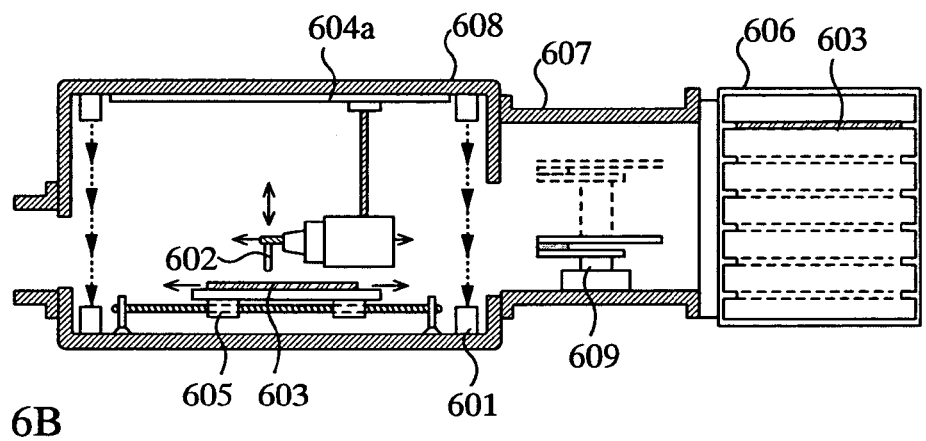

Next, the plasma processing apparatus having a plasma generating means at an atmospheric pressure or a pressure close to the atmospheric pressure used in Embodiment Mode 1 is described with reference to the accompanying drawings. FIGS. 6A and 6B are is perspective views as examples of the plasma processing apparatus used in the invention. The plasma processing apparatus processes an object 603 being processed such as a glass substrate and a resin substrate represented by a plastic substrate each in desired size, which constitutes a display device. As a carrying method of the object 603 being processed, a horizontal carrying can be employed. In the case of using a substrate of the fifth generation or after that, however, a vertical carrying that a substrate is placed vertically may be employed for the purpose of reducing the area occupied by the carrier.

FIG. 6A is a top plan view of the plasma processing apparatus as an example used in the invention, and FIG. 6B is a sectional view thereof. In FIGS. 6A and 6B, the object 603 being processed such as a glass substrate and a resin substrate represented by a plastic substrate each in desired size is set in a cassette chamber 606. As a carrying method of the object 603 being processed, a horizontal carrying can be employed. In the case of using a substrate of the fifth generation or after that, however, a vertical carrying that a substrate is placed vertically may be employed for the purpose of reducing the area occupied by the carrier.

In a carrying chamber 607, the object 603 being processed disposed in the cassette chamber 606 is carried into a plasma processing chamber 608 by a carrying means (robot arm) 609. The plasma processing chamber 608 adjacent to the carrying chamber 607 is provided with an air flow control means 601, a plasma generating means 602 having a cylindrical electrode, rails 604a and 604b for moving the plasma generating means 602, a moving means 605 for moving the object 603 being processed, and the like. Further, a known heating means such as a lamp (now shown) is provided as required.

The air flow control means 601 is provided for the purpose of dust control and controls the air flow so as to be shut out from the outside air by using an inert gas injected from a nozzle 610. The plasma generating means 602 moves to a predetermined position by the rail 604a placed in a carrying direction of the object 603 being processed or the rail 604b placed in a perpendicular direction to the carrying direction. The object 603 being processed moves in the carrying direction by the moving means 605. In the case of actually performing a plasma processing, either of the plasma generating means 602 and the object 603 being processed may move. It is preferable that the plasma generating means 602 and the object 603 being processed have a distance from each other by 3 mm or less, preferably 1 mm or less, and more preferably 0.5 mm or less. By attaching a sensor for measuring the distance in particular, a distance between a surface of the object 603 being processed and a fine hole which is to be an ejecting hole of a process gas may be controlled.

Figure 7A:
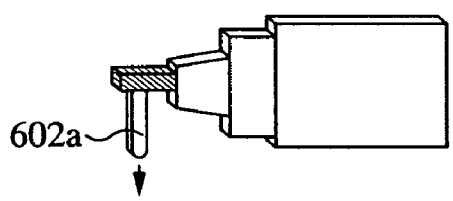
FIGS. 7A to 7E are diagrams each showing a structure of a plasma generating means of an atmospheric pressure plasma processing apparatus of the invention.
Figure 7B:
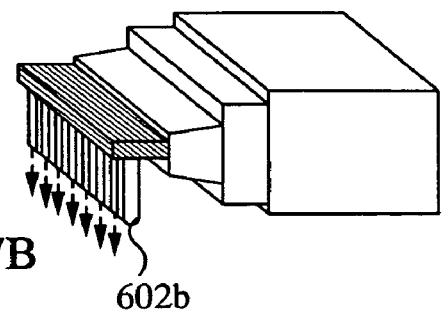
Figure 7C:
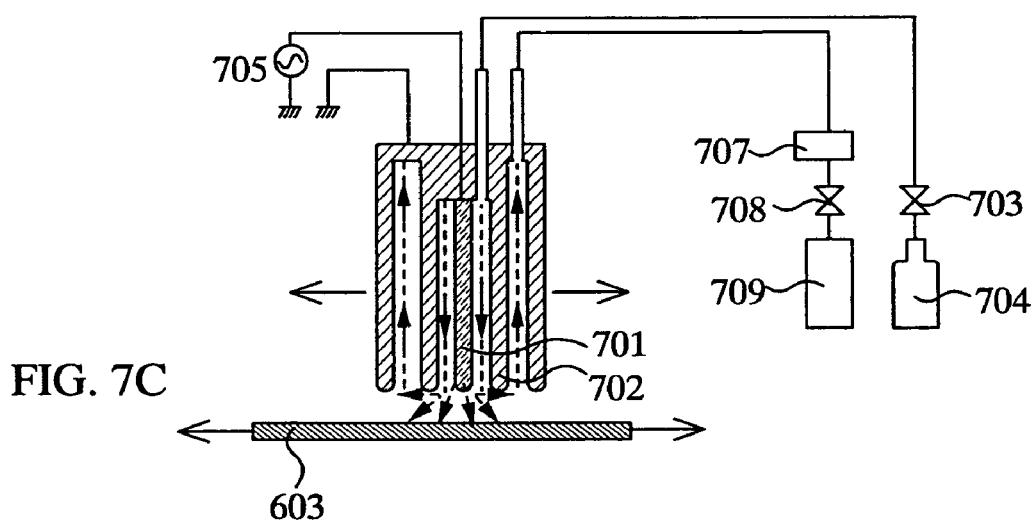
Figure 7D:
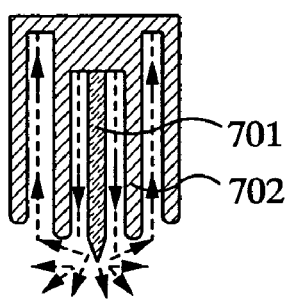
Figure 7E:
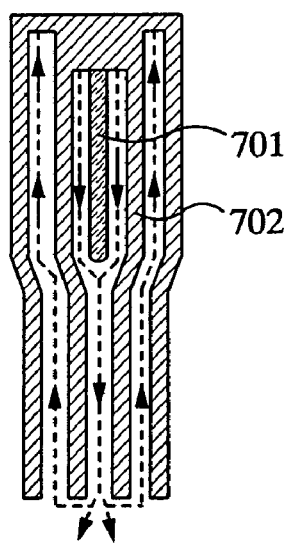

Next, details of the plasma generating means 602 are described with reference to FIGS. 7A to 7E. FIGS. 7A and 7B show perspective views of the plasma generating means 602 having cylindrical electrodes while FIGS. 7C to 7E show sectional views of the cylindrical electrodes.

FIG. 7A is a schematic diagram showing a plasma generating means 602a having a pair of cylindrical electrodes which are to be described later. The plasma generating means 602a can perform plasma processing locally. On the contrary, FIG. 7B is a schematic diagram showing a plasma generating means 602b having a plurality of pairs of cylindrical electrodes arranged linearly which are to be described later. As the plasma generating means 602b has such an arrangement, all the region of the same line can be applied plasma processing at the same time. Accordingly, by scanning the plasma generating means 602b having electrodes arranged linearly in a direction which crosses a moving direction of the object 603 being processed, a plasma processing can be performed to a large area for a short time. Further, by selecting the electrode, a local plasma processing can be performed at an arbitrary position in the same line. Note that the plasma processing is a process such as deposition, etching, and ashing which utilizes a plasma reaction.

Next, the aforementioned pair of cylindrical electrodes are described with reference to FIG. 7C. A broken line corresponds to a path of a gas flow, reference numerals 701 and 702 denote electrodes having conductivity such as aluminum and copper, and the first electrode 701 is connected to a power source (high frequency power source) 705. Note that a cooling system (not shown) for circulating cooling water may be connected to the first electrode 701. By providing the cooling system, heat generated in the case of processing a surface continuously by circulated cooling water can be prevented, thus efficiency can be improved by the continuous processing. The second electrode 702 has a shape surrounding the periphery of the first electrode 701 and is electrically grounded. Then, the first electrode 701 and the second electrode 702 each has a cylindrical nozzle shape having a fine hole for the gas at a tip thereof. Although not shown, a surface of at least one electrode of the first electrode 701 and the second electrode 702 is covered with a solid dielectric. The solid dielectric may be metal oxide such as silica dioxide, aluminum oxide, zirconium dioxide, and titanium dioxide, plastic such as polyethylene terephthalate and polytetrafluoroethylene, glass, and composite oxide such as and barium titanate. The solid dielectric may be a sheet or a film, however, it is preferable that a thickness thereof is 0.05 to 4 mm.

Further, a space between the first electrode 701 and the second electrode 702 is supplied with a processing gas from a gas supply means (gas cylinder) 704 via a valve 703. Then, an atmosphere of this space is substituted and a plasma is generated in the space when a high frequency voltage (10 to 500 MHz) is applied from a high frequency power source 705 to the first electrode 701. Then, by irradiating a reactive gas flow containing chemically active excited species such as ion and radical generated by this plasma to a surface of the object 603 being processed, a predetermined surface processing can be performed on the surface of the object 603 being processed.

Note that a processing gas filled in the gas supply means (gas cylinder) 704 is appropriately set according to a kind of the surface processing performed in the processing chamber. Further, an exhaust gas 706 is introduced to an exhaust system 709 through a filter 707 which removes dust mixed in the gas and a valve 708. Note that the gas introduced in the exhaust system 709 may be reused by being purified to remove the mixed dust by passing through the filter. By reusing in this manner, efficiency of the gas can be improved.

Further, a cylindrical electrode of which section is different than FIG. 7C is shown in FIGS. 7D and 7E. In FIG. 7D, the first electrode 701 is longer than the second electrode 702 and the first electrode 701 has a sharp angle while a cylindrical electrode shown in FIG. 7E has a shape to eject an ionized gas flow externally that is generated between the first electrode 701 and the second electrode 702. According to the invention which uses a plasma processing apparatus which operates at an atmospheric pressure or a pressure close to the atmospheric pressure, time for vacuuming and venting which are required for a reduced pressure apparatus is not required and a complicated vacuum system is not required to be provided. In the case of using a large substrate, in particular, a chamber becomes necessarily large and processing time becomes long to reduce pressure in the chamber. Therefore, this apparatus which operates at an atmospheric pressure or a pressure close to the atmospheric pressure is efficient and production cost can be reduced.

Embodiment Mode 2

This embodiment mode is characterized in that a wiring is formed by using only a linear liquid droplet ejecting apparatus having a liquid droplet ejecting head provided with a plurality of liquid droplet ejecting orifices.

A material containing conductive ultrafine particles is ejected from the linear liquid droplet ejecting apparatus to a glass substrate 801. At this time, by scanning a head 802 which ejects liquid droplets or the glass substrate 801, a wiring pattern is formed (FIG. 8B). By processing the glass substrate 801 with heat on which the wiring pattern is formed, a wiring 804 is formed (FIG. 8C).

Here, a diameter of a nozzle used for the liquid droplet ejecting means described above is set 0.1 to 50 μm (more preferably 0.6 to 26 μm) and an ejecting amount of a compound ejected from the nozzle is set 0.00001 pl to 50 pl (more preferably 0.0001 to 40 pl). This ejecting amount increases in proportion to a size of the diameter of the nozzle. A distance between the object being processed and a nozzle ejecting hole is preferably as close to each other as possible in order to drop at a desired position, which is preferably about 0.1 to 2 mm. Note that the ejecting amount can be controlled by changing a pulse voltage applied to a piezoelectric element, even without changing the diameter of the nozzle. These ejecting conditions are preferably set so that a line width becomes about 10 μm or less.

Note that a conductive material dissolved or dispersed in solvent is used for a compound ejected from ejecting holes by a liquid droplet ejecting method. A conductive material corresponds to metal such as Ag, Au, Cu, Ni, Pt, Pd, Ir, Rh, W, and Al, metal sulfide of Cd and Zn, oxide of Fe, Ti, Si, Ge, Si, Zr, Ba, and the like, and fine particles or is dispersible nanoparticles of silver halide. Further, indium tin oxide (ITO) used as a transparent conductive film, ITSO formed of indium tin oxide and silicon oxide, organic indium, organotin, zinc oxide, titanium nitride and the like correspond. However, the compound ejected from the ejecting holes is preferably solvent dissolved or dispersed with any material of gold, silver and copper in consideration with a resistivity. More preferably, silver and copper which are low in resistance are used. In the case of using silver and copper, however, a barrier film is preferably formed in combination in order to prevent impurities. As a barrier film, silicon nitride film and nickel boron (NiB) can be used.

Further, particles having a plurality of layers in which another conductive material is coated around a conductive material may be used. For example, particles having three-layer structure in which nickel boron (NiB) is coated around copper and silver is coated around thereof may be used as well. As the solvent, esters such as butyl acetate and ethyl acetate, alcohols such as isopropyl alcohol and ethyl alcohol, and organic solvent such as methyl ethyl ketone and acetone and the like are used. Viscosity of the compound is preferably 20 cp or less in order to prevent drying and achieve a smooth ejection of the compound from the ejecting holes. Further, a surface tension of the compound is preferably 40 mN/m or less. However, the viscosity of the compound and the like are preferably controlled appropriately in accordance with solvent used and application. For example, viscosity of a compound obtained by dissolving or dispersing ITO, organic indium, or organic tin in solvent is 5 to 20 mPa·S, viscosity of a compound obtained by dissolving or dispersing silver in a solvent is set 5 to 20 mPa·S and viscosity of a compound obtained by dissolving or dispersing gold in solvent is preferably set 5 to 20 mPa·S.

Figure 8A:
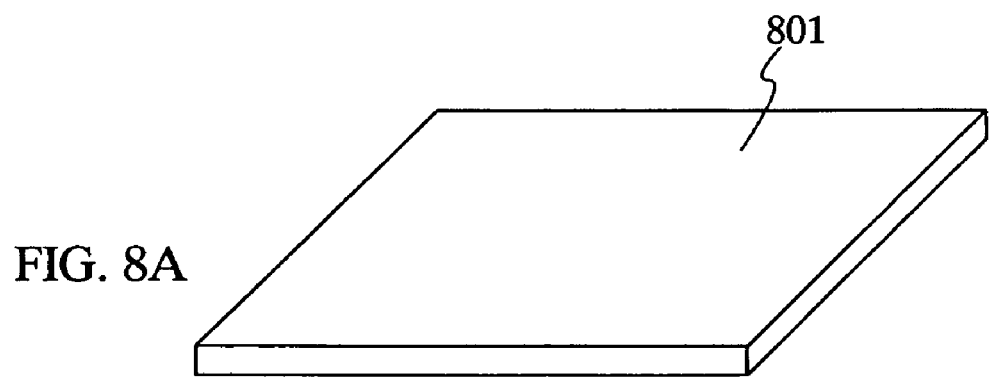
FIGS. 8A to 8C are schematic perspective views of a process according to Embodiment Mode 2 of the invention.
Figure 8B:
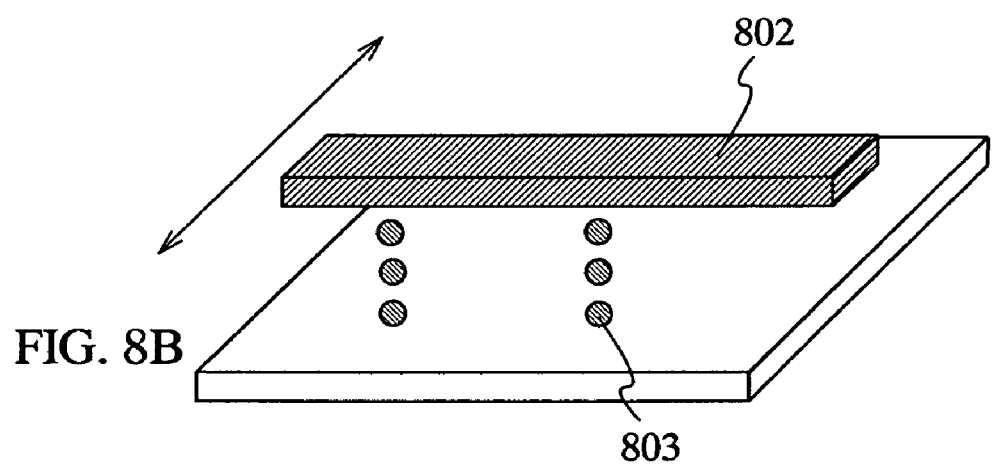
Figure 8C:
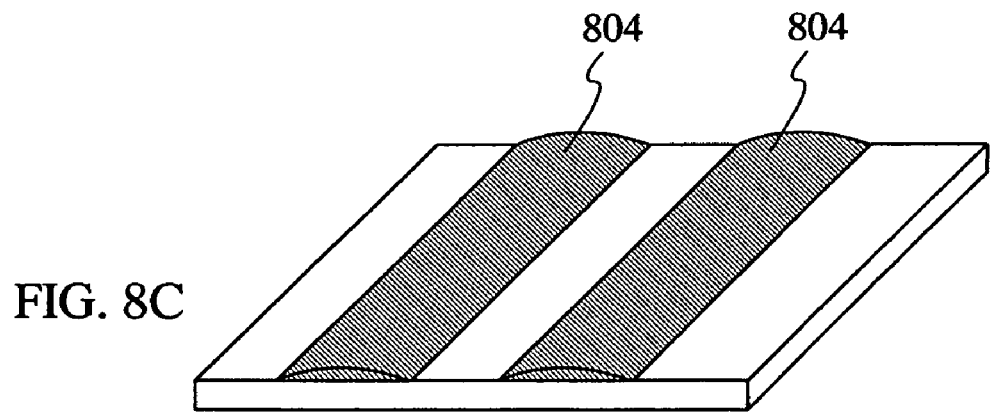

By changing liquid droplets ejected from resist to a material containing conductive ultrafine particles as shown in FIGS. 8A to 8C, a wiring patterned directly can be formed. Accordingly, a resist mask is not required, therefore, higher efficiency and lower cost can be achieved. In the case where the size of the conductive fine particles is small and a process for forming finely is not required, it is efficient to use the aforementioned method.

Embodiment Mode 3

This embodiment mode is characterized in that the plasma processing apparatus only is used to form a wiring. Hereafter, this embodiment mode is described.

Figure 9A:
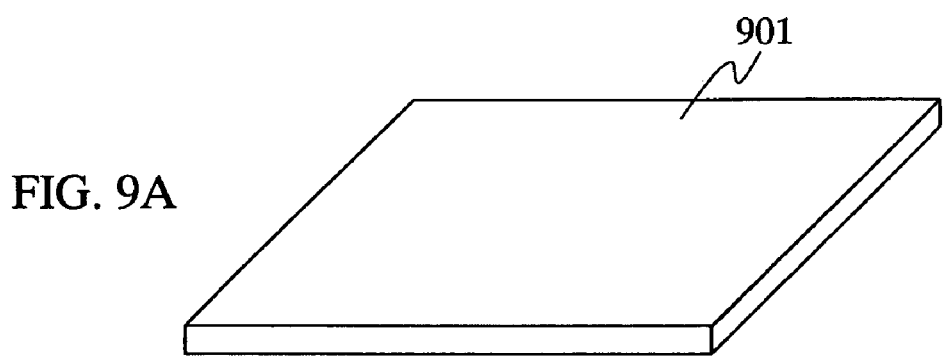
FIGS. 9A to 9D are schematic perspective views of a process according to Embodiment Mode 3 of the invention.
Figure 9B:
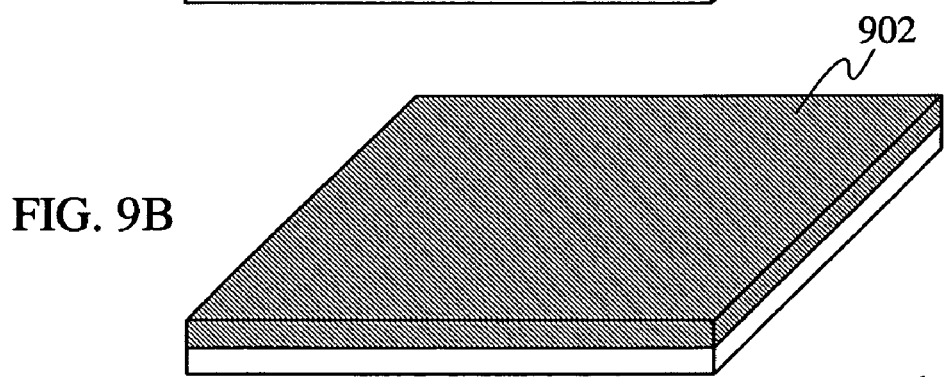
Figure 9C:
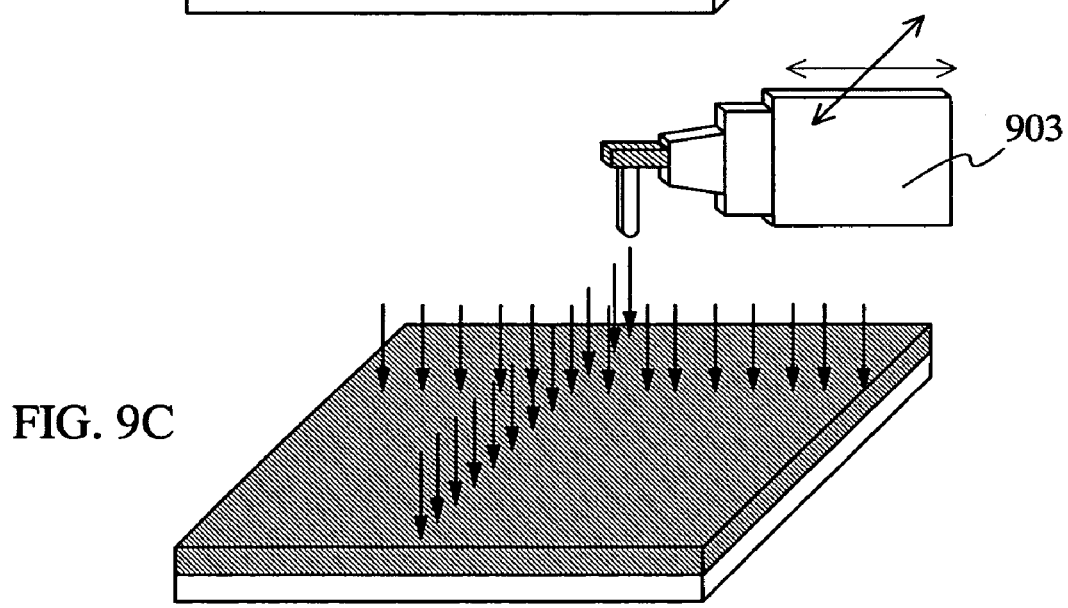

First, a conductive film 902 which is to be a wiring is formed on a substrate 901 being processed by using a sputter processing method (FIGS. 9A and 9B). Next, the conductive film 902 is selectively etched in an atmospheric pressure or a pressure close to the atmospheric pressure by using the plasma processing apparatus having the plasma generating means provided with a pair of cylindrical electrodes or having a plasma generating means having a plurality of pairs of cylindrical electrodes arranged linearly which are also used in Embodiment Mode 1 (FIG. 9C). The etching is performed by scanning the substrate 901 being processed in one direction (or the plasma generating means 903 in one direction) so that a portion required to be removed only is selectively etched in the conductive film 902.

Figure 9D:
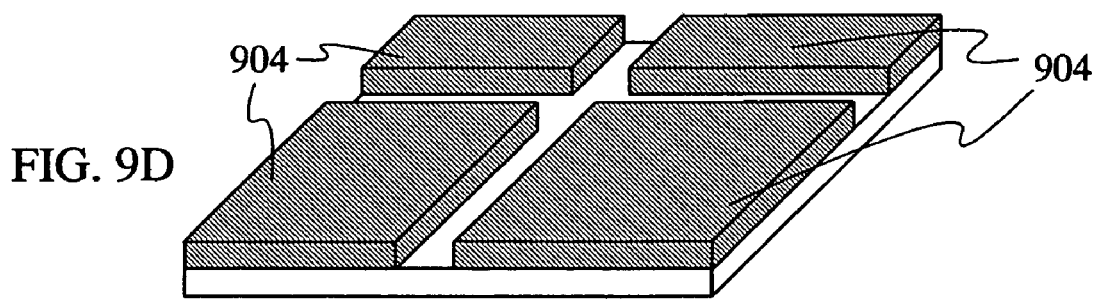

As described above, the object being processed is selectively etched and divided, thereby the wiring 904 can be formed (FIG. 9D).

According to the aforementioned method, a forming process of a resist pattern is omitted and the process can be simplified.

EMBODIMENT

Embodiment 1

Described in this embodiment is a manufacturing method of a display device to which the invention is applied by using a plasma processing apparatus which performs a local plasma surface processing by using a plasma generating means having a liquid droplet ejecting apparatus having a liquid droplet ejecting head provided with a plurality of liquid droplet ejecting orifices or a plasma generating means provided with a plurality of pairs of cylindrical electrodes arranged linearly.

Figure 10A:
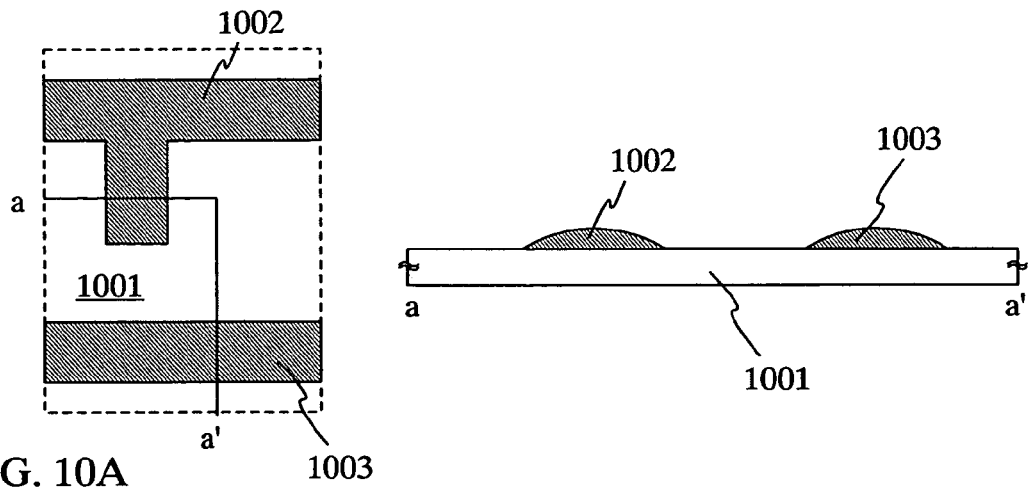
FIGS. 10A to 10C are schematic diagrams showing a manufacturing process according to Embodiment 1 of the invention. A diagram on the left is a top plan view while a diagram on the right is a sectional view along a-a' of the diagram on the left in each diagram.

By ejecting a conductive compound at a required position on a substrate 1001 being processed formed of various materials such as glass, quartz, a semiconductor, a plastic film, metal, glass epoxy resin, and ceramic by a liquid droplet ejecting apparatus having a liquid droplet ejecting head provided with a plurality of liquid droplet ejecting is orifices, a gate electrode and wiring 1002, and a capacitor electrode and wiring 1003 are formed (FIG. 10A). Here, the gate electrode and wiring 1002 has an integrated structure. Moreover, a capacitor electrode and a wiring connected to the capacitor electrode are formed integrally.

Next, by applying a heating process to a substrate on which the gate electrode and wiring 1002 and the capacitor electrode and wiring 1003 are formed, solvent contained in the liquid droplets is volatilized. Note that the heating process may be performed any of at the time of liquid droplet ejection by the linear liquid droplet ejecting apparatus, after the liquid droplet ejection in an arbitrary region, or after finishing all the process.

Figure 10B:
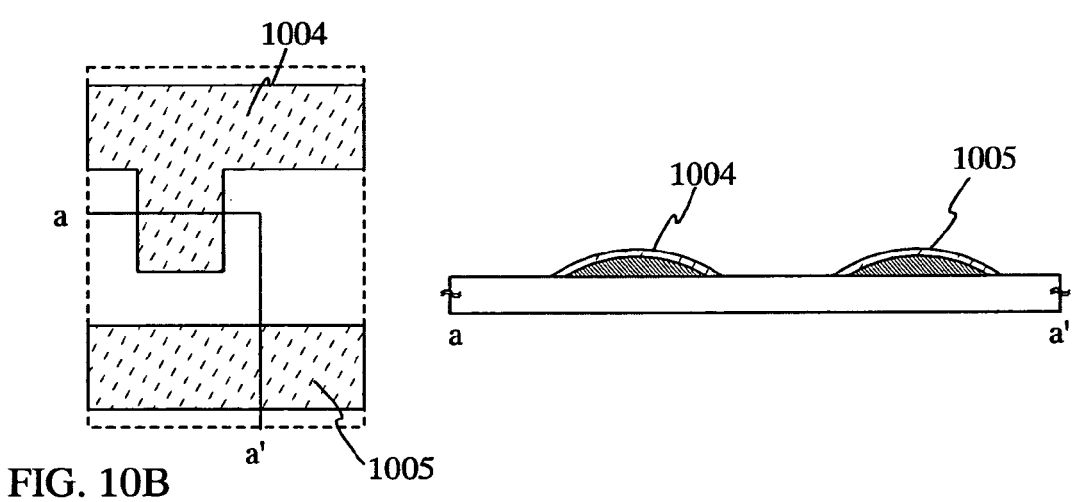

Subsequently, resists 1004 and 1005 which cover the gate electrode and wiring 1002 and the capacitor electrode and the wiring 1003 that are ejected in the preceding step are formed by using the linear liquid droplet ejecting apparatus having a liquid droplet ejecting head provided with a plurality of liquid droplet ejecting orifices (FIG. 10B). Note that the linear liquid droplet ejecting apparatus used for forming the gate electrode and wiring 1002 and the capacitor electrode and wiring 1003 and the linear liquid droplet ejecting apparatus for forming a resist may be an individual apparatus each, or one apparatus having two heads which can eject liquid droplets of different materials respectively.

Figure 10C:
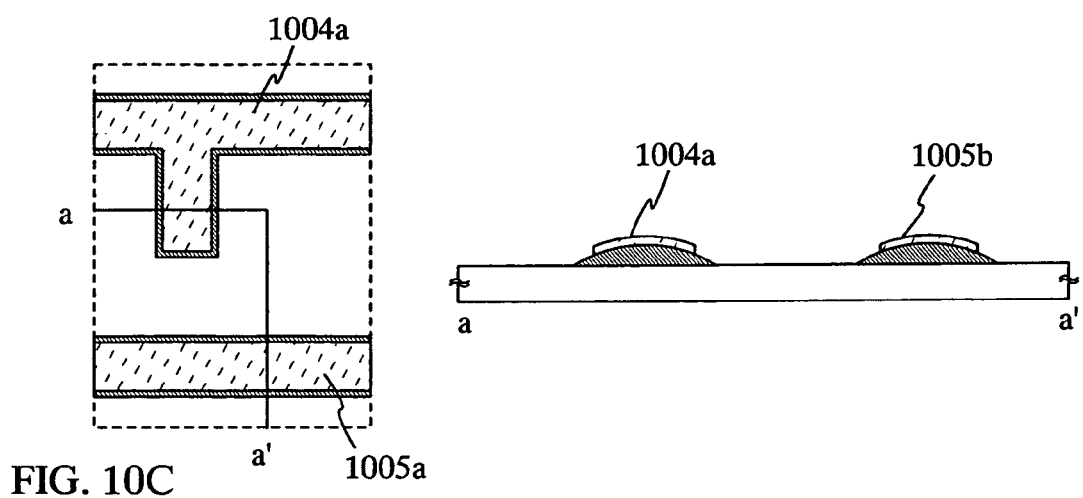

Next, a resist pattern is formed by processing the resists into a desired shape through exposure and development (FIG. 10C). Note that in the case where the shape of the resist formed by using the linear liquid droplet ejecting apparatus can be used as a mask as it is, the process of resist such as exposure and development is not particularly required.

Figure 11A:
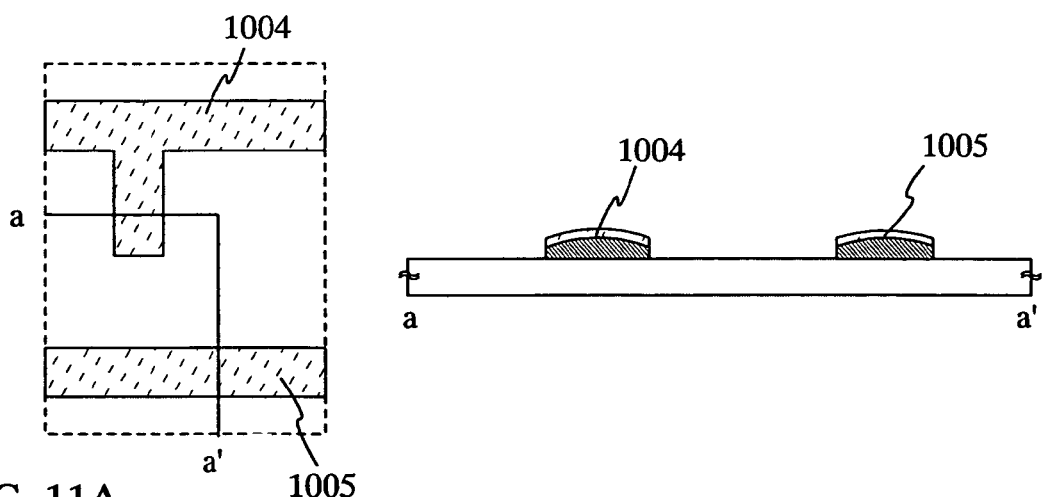
FIGS. 11A to 11C are schematic diagrams showing a manufacturing process according to Embodiment 1 of the invention. A diagram on the left is a top plan view while a diagram on the right is a sectional view along a-a' of the diagram on the left in each diagram.
Figure 11B:
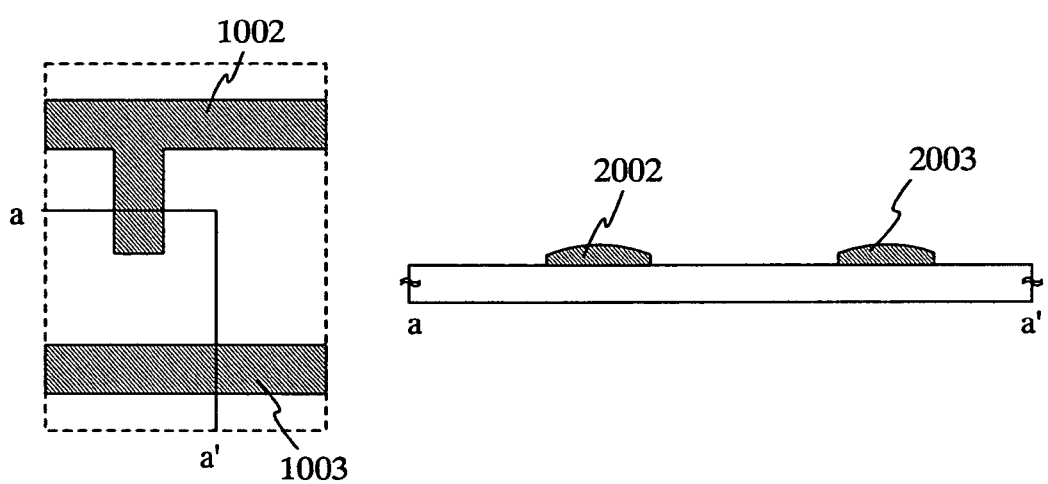

Next, plasma is formed at an atmospheric pressure or a pressure close to the atmospheric pressure by using a plasma generating apparatus having a plasma generating means having a pair of cylindrical electrodes or a plasma generating means having a plurality of pairs of cylindrical electrodes arranged linearly, arbitrary portions of the gate electrode and wiring 1002 and the capacitor electrode and the wiring 1003 are locally etched with resists 1004a and 1005b as masks, then the resists are removed by ashing using the plasma processing apparatus (FIGS. 11A and 11B). Note that the local etching is performed in this embodiment as described above, however, a known etching apparatus may be used as well.

Further, a wiring may be formed by ejecting liquid droplets containing conductive particles using the liquid droplet ejecting apparatus only as shown in FIGS. 8A to 8C of Embodiment Mode 2 when processing precision is not demanded to be so high. In this case, the process can be simplified and the efficiency of the material can be improved since the resist is not required to be used.

Through the aforementioned process, a gate electrode and wiring 2002, a capacitor electrode and wiring 2003 are formed. Note that as a material for forming the gate electrode and the wiring 2002, and the capacitor electrode and the wiring 2003 by the liquid droplet ejecting method, metal such as Ag, Au, Cu, Ni, Pt, Pd, Ir, Rh, W, and Al, metal sulfide of Cd and Zn, oxide of Fe, Ti, Si, Ge, Si, Zr, and Ba, and fine particles of silver halide or dispersible nanoparticles and the like dissolved or dispersed in solvent may be used.

Figure 11C:
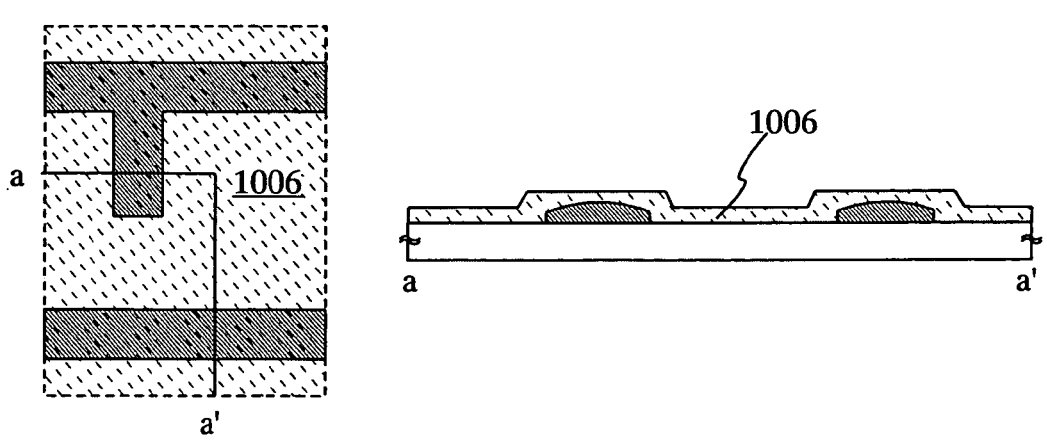

After that, a gate insulating film 1006 is formed by a known method such as a CVD method (Chemical Vapor Deposition method) (FIG. 11C). In this embodiment, a silicon nitride film is formed by the CVD method as the gate insulating film 1006, however, a silicon oxide film or a laminated structure of those films may be formed as well.

Figure 12A:
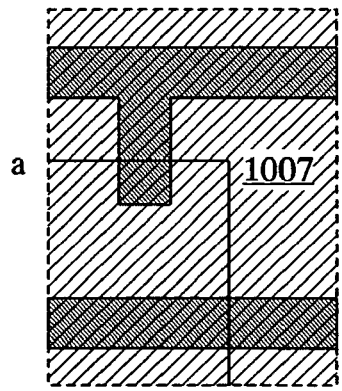
FIGS. 12A to 12C are schematic diagrams showing a manufacturing process according to Embodiment 1 of the invention. A diagram on the left is a top plan view while a diagram on the right is a sectional view along a-a' of the diagram on the left in each diagram.
Figure 12A:
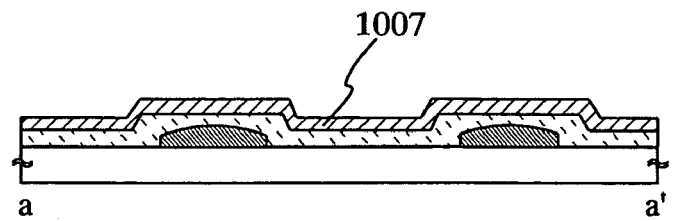

Moreover, an active semiconductor layer 1007 is formed in thickness of 25 to 80 nm (more preferably 30 to 60 nm) by a sputtering method, an LP (low pressure) CVD method, a plasma CVD method and the like. The active semiconductor layer 1007 is an amorphous semiconductor film represented by an amorphous silicon film and is formed on the entire surface of the substrate 1001 being processed (FIG. 12A).

Figure 12B:
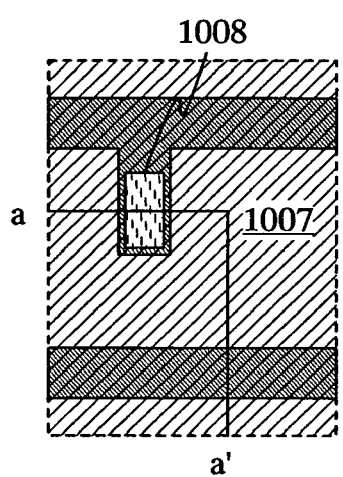
Figure 12B:
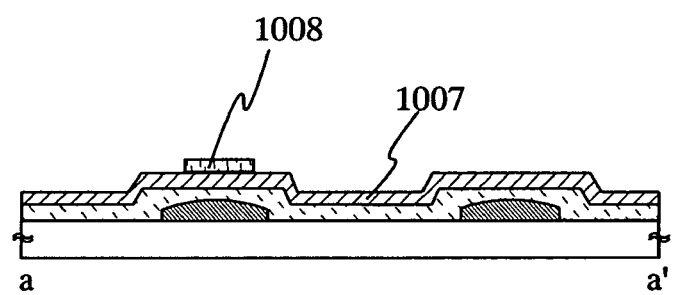
Figure 12C:
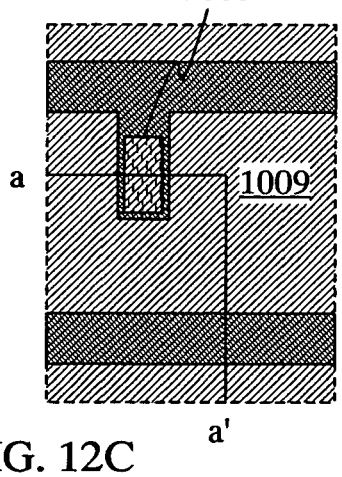
Figure 12C:
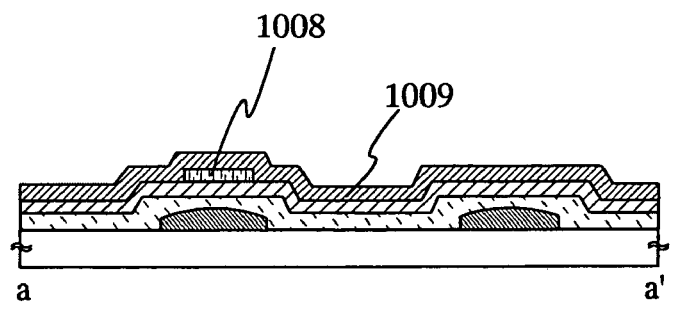

Next, a channel protective film (etch stop film) 1008 is formed by using a resist mask after forming a silicon nitride film and the like on the entire surface of the substrate being processed (FIG. 12B). The channel protective film 1008 may be formed by using the linear liquid droplet ejecting apparatus having a liquid droplet ejecting head provided with a plurality of liquid droplet ejecting orifices or a photolithography process having a step for forming a resist film by a spin coating method. Subsequently, an amorphous semiconductor film 1009 to which impurity elements which impart N-type conductivity are added is formed on the entire surface of the substrate being processed (FIG. 12C).

Figure 13A:
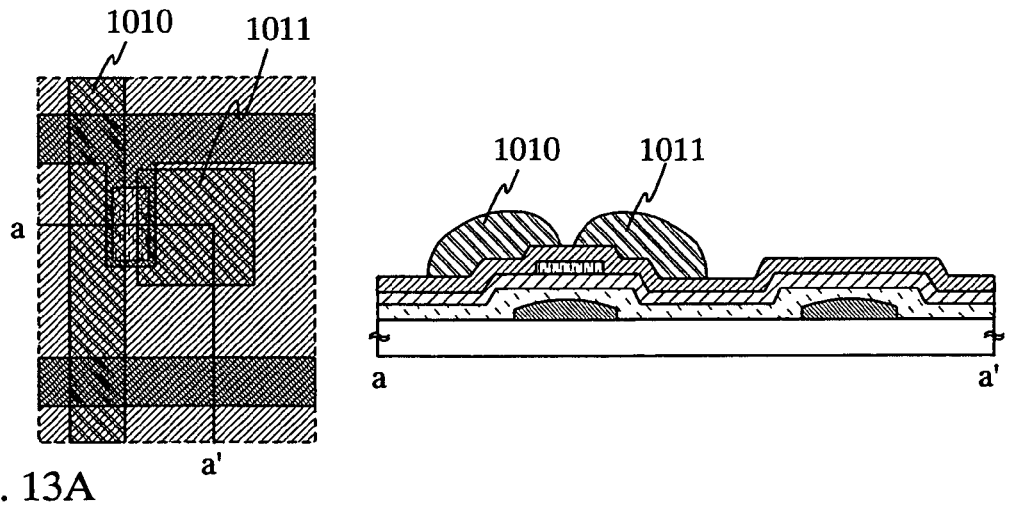
FIGS. 13A to 13C are schematic diagrams showing a manufacturing process according to Embodiment 1 of the invention. A diagram on the left is a top plan view while a diagram on the right is a sectional view along a-a' of the diagram on the left in each diagram.

After that, source/drain electrodes and wirings 1010 and 1011 are formed by using the linear liquid droplet ejecting apparatus having a liquid droplet ejecting head provided with a plurality of liquid droplet ejecting orifices (FIG. 13A). Note that the source/drain electrodes and wirings 1010 and 1011 may be patterned similarly to the gate electrode and wiring 1002 and the capacitor electrode and wiring 1003 shown in FIGS. 10A to 11B. That is, a resist is formed after ejecting liquid droplets containing conductive particles, then the source/drain electrodes and wirings 1010 and 1011 may be formed through patterning. Further, a wiring may be formed by ejecting liquid droplets containing conductive particles using the liquid droplet ejecting apparatus only. In this case, the process can be simplified and the efficiency of the material can be improved as the resist is not required to be provided. As a material for forming the source/drain electrodes and wirings 1010 and 1011, metal such as Ag, Au, Cu, Ni, Pt, Pd, Ir, Rh, W, and Al, metal sulfide of Cd and Zn, oxide of Fe, Ti, Si, Ge, Si, Zr, and Ba, and fine particles of silver halide or dispersible nanoparticles and the like dissolved or dispersed in solvent may be used similarly to the gate electrode and wiring.

Figure 13B:
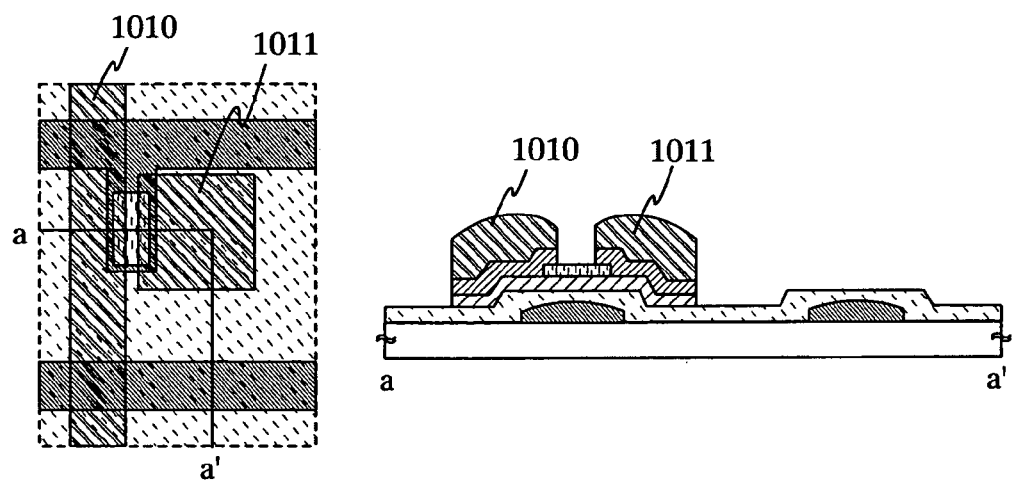

After that, plasma is formed at an atmospheric pressure or a pressure close to the atmospheric pressure by using a plasma processing apparatus having a plasma generating means provided with a pair of cylindrical electrodes or a plasma generating means provided with a plurality of pairs of cylindrical electrodes arranged linearly, and by scanning the plasma, arbitrary positions of the amorphous semiconductor films 1009 to which impurity elements which impart N-type conductivity are added are etched with the source/drain electrodes and wirings 1010 and 1011 as masks (FIG. 13B).

Figure 13C:
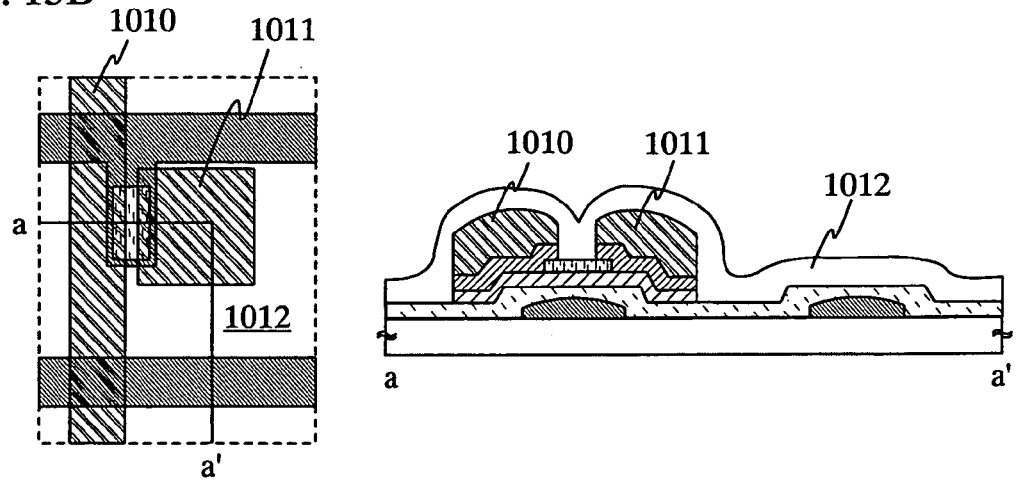

Further, a protective film 1012 is formed by the CVD method and the like (FIG. 13C). In this embodiment, a silicon nitride film is formed by the CVD method as the protective film 1012, however, a silicon oxide film or a laminated structure of these films may be formed as well. Also, an organic resin film such as an acryl film can be used.

Figure 14A:
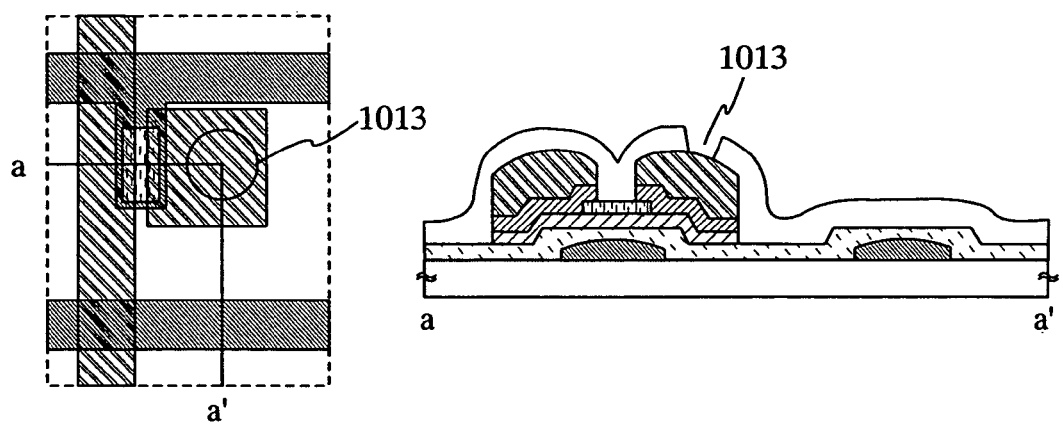
FIGS. 14A and 14B are schematic diagrams showing a manufacturing process according to Embodiment 1 of the invention. A diagram on the left is a top plan view while a diagram on the right is a sectional view along a-a' of the diagram on the left in each diagram.

After that, a resist is patterned through a known photolithography process after ejecting the resist by the linear liquid droplet ejecting apparatus (not shown). Further, plasma is formed at an atmospheric pressure or a pressure close to the atmospheric pressure by using a plasma processing apparatus having a plasma generating means provided with a pair of cylindrical electrodes or a plasma generating means provided with a plurality of pairs of cylindrical electrodes arranged linearly, thereby the protective film 1012 is etched and a contact hole 1013 is formed (FIG. 14A).

Figure 14B:
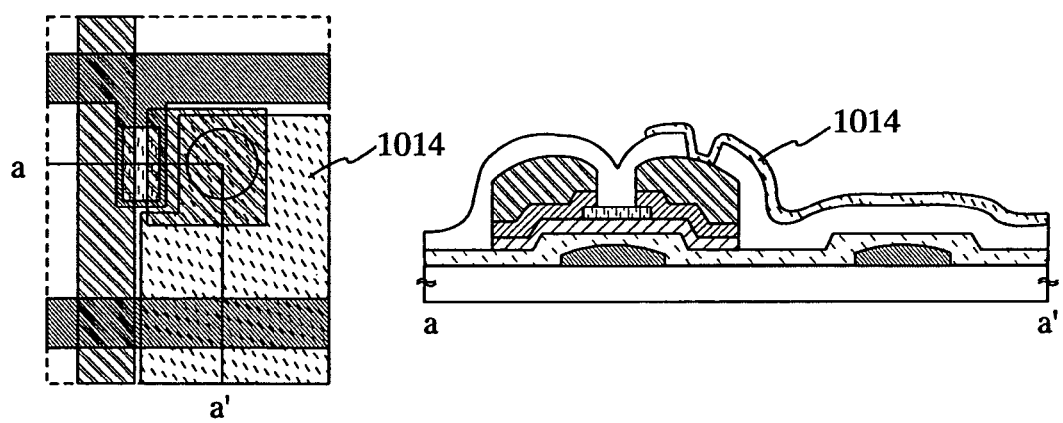

After that, a pixel electrode 1014 is formed by the linear liquid droplet ejecting apparatus having a liquid droplet ejecting head provided with a plurality of liquid droplet ejecting orifices (FIG. 14B). The pixel electrode 1014 may be directly drawn by the linear liquid droplet ejecting apparatus or may be formed by patterning similarly to the gate electrode and wiring 1002 and the capacitor electrode and wiring 2003 shown in FIGS. 10A to 11B. As a material for forming the pixel electrode 1014, conductive materials such as metal such as Ag, Au, Cu, Ni, Pt, Pd, Ir, Rh, W, and Al, metal sulfide of Cd and Zn, oxide of Fe, Ti, Si, Ge, Si, Zr, Ba, and the like, fine particles of silver halide or dispersible nanoparticles, and a transparent conductive film such as indium tin oxide (ITO), ITSO formed of indium tin oxide and silicon oxide, organic indium, organotin, zinc oxide, and titanium nitride can be used.

As described above, after forming TFTs on the substrate being processed, these are assembled in cells to manufacture a display device. Note that the cells may be assembled by a known method.

Embodiment 2

In Embodiment 1, a manufacturing method of a channel protective type display device is described, while a manufacturing method of a channel-etch type display is described in this embodiment.

Figure 16A:
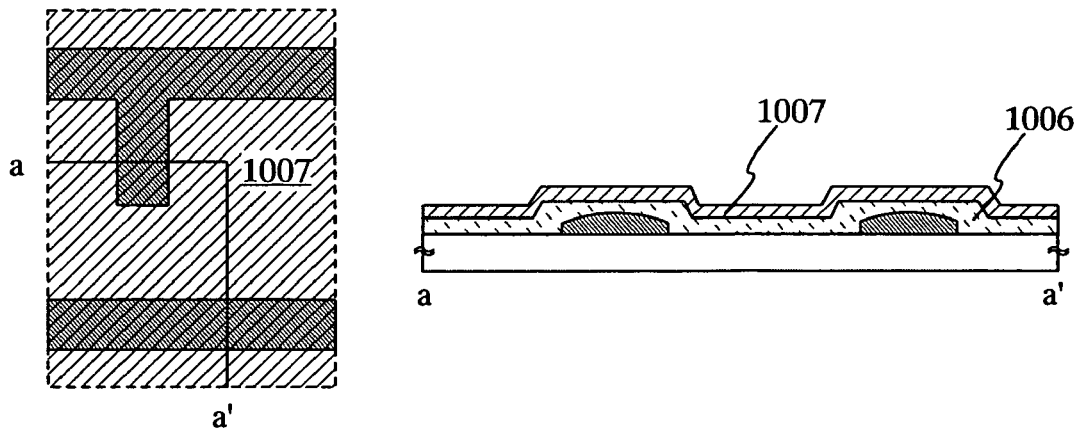
FIGS. 16A to 16C are schematic diagrams showing a manufacturing process according to Embodiment 2 of the invention. A diagram on the left is a top plan view while a diagram on the right is a sectional view along a-a' of the diagram on the left in each diagram.

A display device may be formed up to FIG. 16A similarly to up to FIG. 12A described in Embodiment 1, therefore, the description is omitted here. Further, identical reference numerals are used for the identical portions through FIGS. 10A to 14B described in Embodiment 1.

Figure 16B:
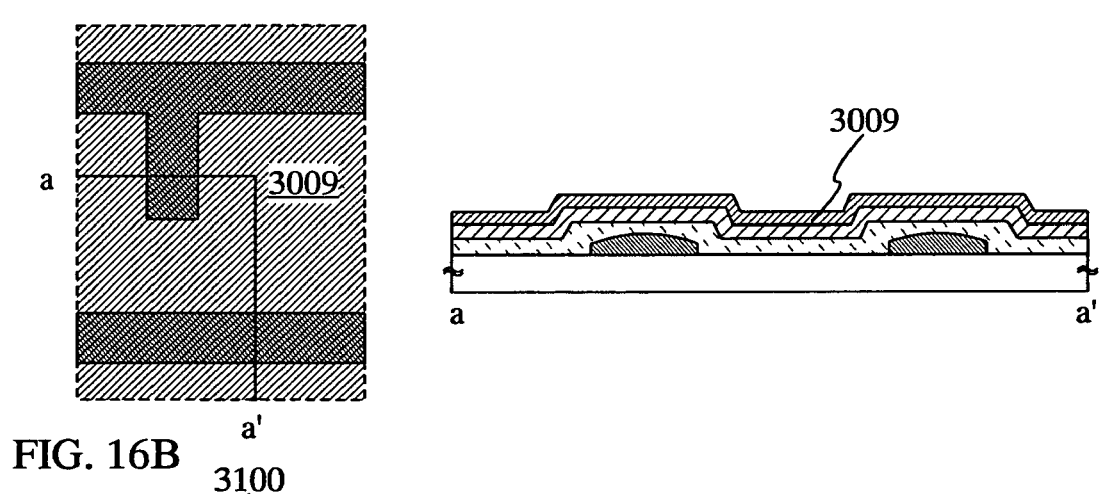

First, a semiconductor layer 1007 is formed on the gate insulating film 1006 as shown in FIG. 16A similarly to Embodiment 1. After that, an amorphous semiconductor film 3009 to which impurity elements which impart N-type conductivity type are added is formed on the semiconductor 1007 (FIG. 16B).

Figure 16C:
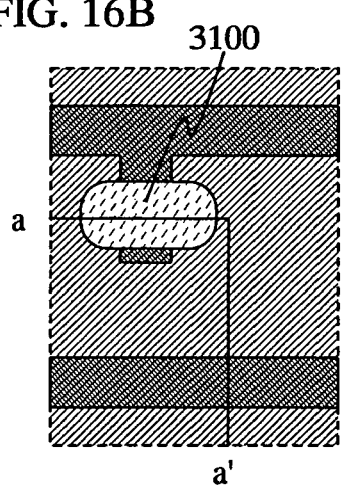

Subsequently, an insulating film 3100 is formed on the amorphous semiconductor film 3009 so as to cover the gate electrode and the periphery thereof (FIG. 16C). Here, the insulating film 3100 is formed by selectively ejecting a compound by the liquid droplet ejecting means. In the case where processing precision is demanded, however, the insulating film 3100 may be formed by forming a resist after forming the insulating film and patterning by exposure and development.

Figure 17A:
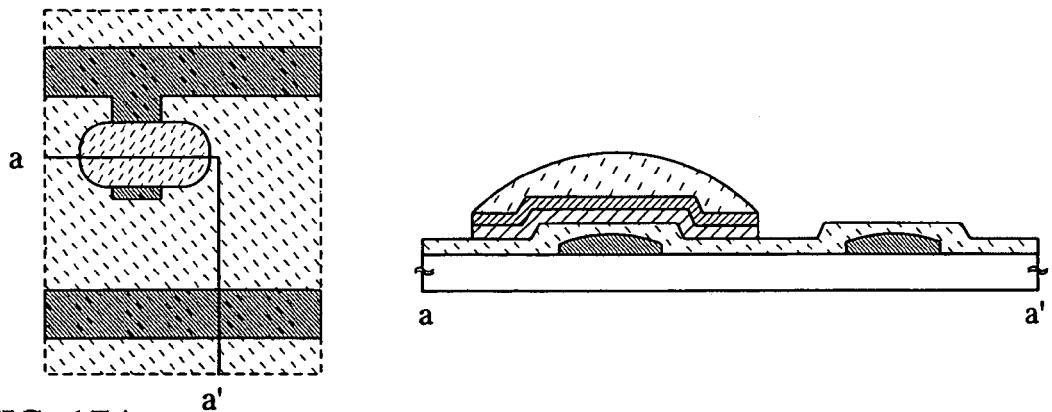
FIGS. 17A to 17C are schematic diagrams showing a manufacturing process according to Embodiment 2 of the invention. A diagram on the left is a top plan view while a diagram on the right is a sectional view along a-a' of the diagram on the left in each diagram.

After that, arbitrary positions of the semiconductor layer 1007 and the amorphous semiconductor film 3009 to which impurity elements which impart N-type conductivity are added, which are not covered with the insulating film are etched by forming plasma at an atmospheric pressure or a pressure close to the atmospheric pressure by using a plasma processing apparatus having a plasma generating means provided with a pair of cylindrical electrodes or a plasma generating means provided with a plurality of pairs of cylindrical electrodes arranged linearly (FIG. 17A).

Figure 17B:
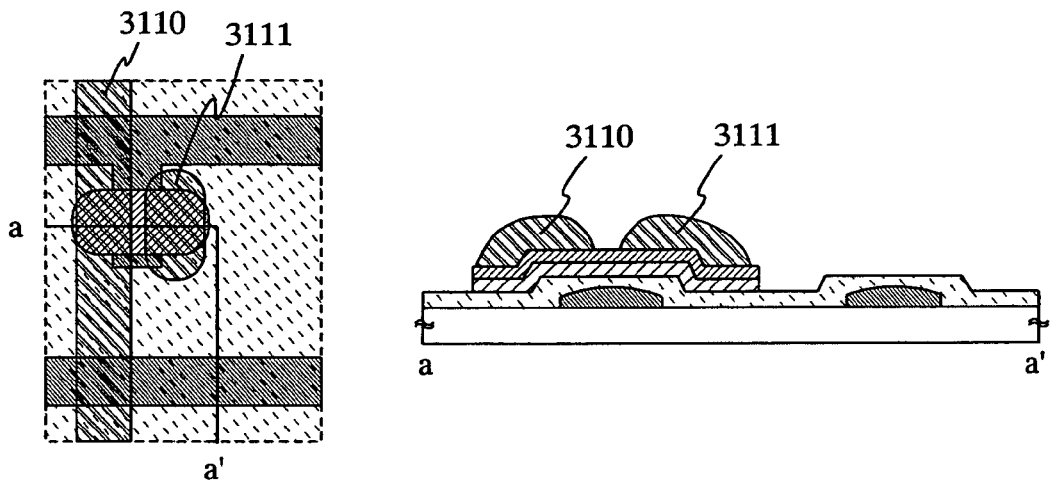
Figure 17C:
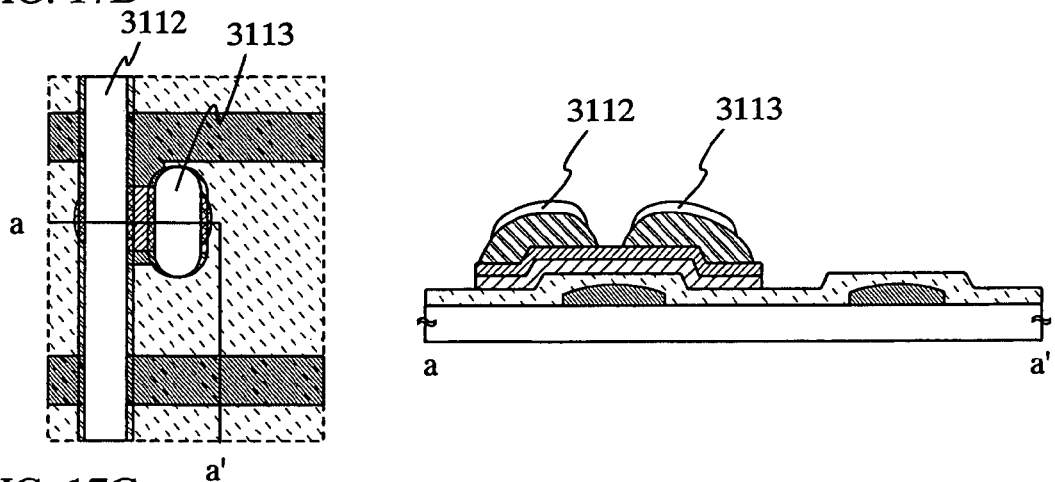

Subsequently, after removing the insulating film 3100 by ashing using the plasma processing apparatus, wirings 3110 and 3111 are formed by ejecting liquid droplets containing conductive particles by using the linear liquid droplet ejecting apparatus having a liquid droplet ejecting head provided with a plurality of liquid droplet ejecting orifices (FIG. 17B). Next, resists 3112 and 3113 are formed on the wirings 3110 and 3111 by using the liquid droplet ejecting apparatus (FIG. 17C). The resists 3112 and 3113 may be formed of patterns processed into desired shapes by exposure and development or the shape of a resist formed by using the liquid droplet ejecting apparatus may be used as a mask as it is.

Subsequently, similarly to the gate electrode and wiring shown in FIGS. 10A to 11B of Embodiment 1, source/drain electrodes and wirings 3010 and 3011 are formed by performing etching with the resists 3112 and 3113 as masks by using the plasma processing apparatus having a plasma generating means provided with a pair of cylindrical electrodes or a plasma generating means provided with a plurality of pairs of cylindrical electrodes arranged linearly. Note that although not shown here, in the case of forming the source/drain electrodes and wirings 3010 and 3011, the source/drain electrodes and wirings may be formed by ejecting liquid droplets containing conductive particles by using the liquid droplet ejecting apparatus only as shown in FIGS. 8A to 8C of Embodiment Mode 2 when the processing precision is not demanded to be so high.

Figure 18A:
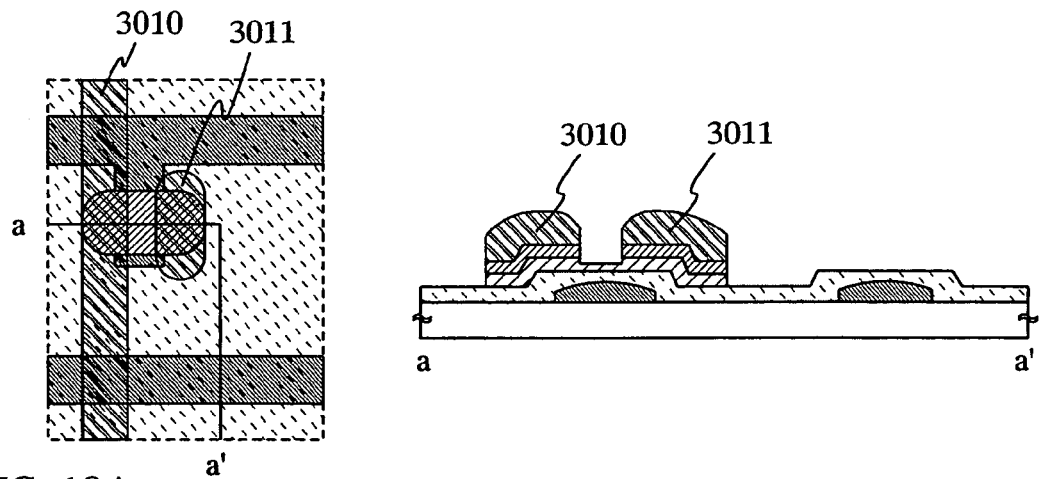
FIGS. 18A to 18C are schematic diagrams showing a manufacturing process according to Embodiment 2 of the invention. A diagram on the left is a top plan view while a diagram on the right is a sectional view along a-a' of the diagram on the left in each diagram.

After that, plasma is formed at an atmospheric pressure or a pressure close to the atmospheric pressure by using the plasma processing apparatus, and by scanning this, arbitrary positions of the amorphous semiconductor film 3009 to which impurity elements which impart N-type conductivity are added are etched (FIG. 18A).

Figure 18B:
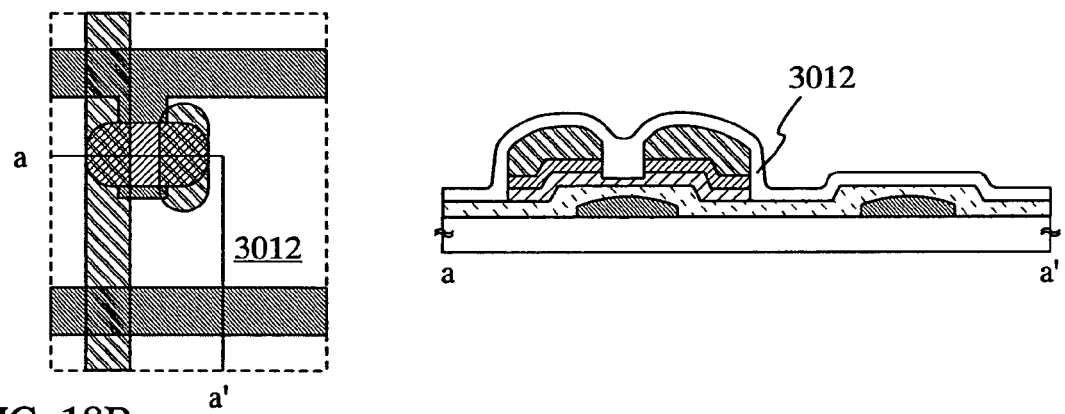

Further, a protective film 3012 is formed by the CVD method and the like (FIG. 18B). In this embodiment, a silicon nitride film is formed by the CVD method as the protective film 3012, however, a silicon oxide film or a laminated structure of these films may be formed as well. Also, an organic resin film such as an acryl film can be used. Moreover, the protective film 3012 may be formed by using the liquid droplet ejecting apparatus as well.

Figure 18C:
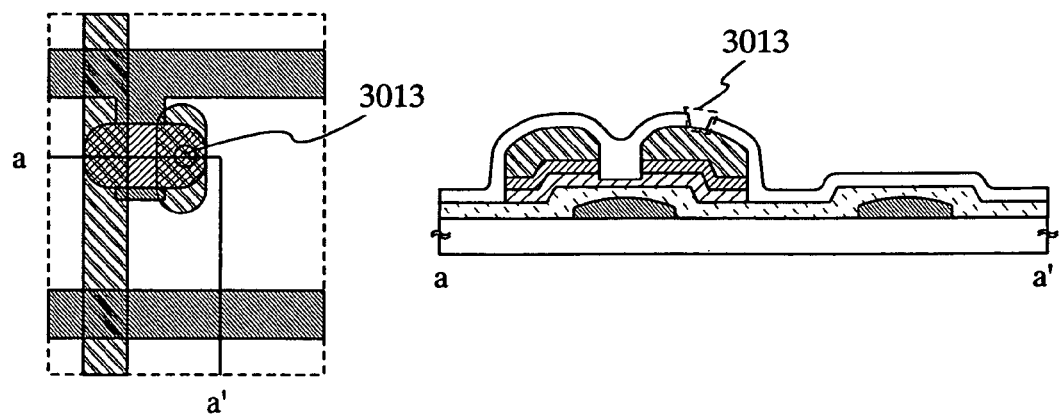

After that, a resist is patterned by a known photolithography process after ejecting the resist by the linear liquid droplet ejecting apparatus (not shown). Further, plasma is formed at an atmospheric pressure or a pressure close to the atmospheric pressure by using a plasma processing apparatus having a plasma generating means provided with a pair of cylindrical electrodes or a plasma generating means provided with a plurality of pairs of cylindrical electrodes arranged linearly, thereby the protective film 3012 is etched and a contact hole 3013 is formed (FIG. 18C).

Figure 19:
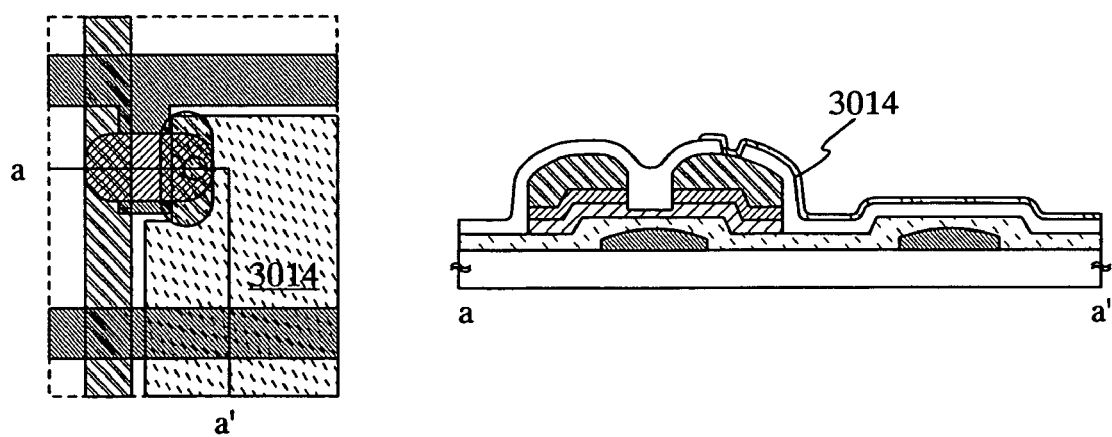
FIG. 19 is a schematic diagram showing a manufacturing process according to Embodiment 2 of the invention. A diagram on the left is a top plan view while a diagram on the right is a sectional view along a-a' of the diagram on the left.

After that, a pixel electrode 3014 is formed by the linear liquid droplet ejecting apparatus having a liquid droplet ejecting head provided with a plurality of liquid droplet ejecting orifices (FIG. 19). The pixel electrode 3014 may be directly drawn by the linear liquid droplet ejecting apparatus or may be formed by patterning similarly to the gate electrode and wiring 1002 and the capacitor electrode and wiring 1003 shown in FIGS. 10A to 11B. As a material for forming the pixel electrode 3014, conductive materials such as metal such as Ag, Au, Cu, Ni, Pt, Pd, Ir, Rh, W, and Al, metal sulfide of Cd and Zn, oxide of Fe, Ti, Si, Ge, Si, Zr, and Ba, fine particles of silver halide or dispersible nanoparticles, and a transparent conductive film such as indium tin oxide (ITO), ITSO formed of indium tin oxide and silicon oxide, organic indium, organotin, zinc oxide, and titanium nitride can be used.

As described above, after forming TFTs on the substrate being processed, these are assembled in cells to manufacture a display device. Note that the cells may be assembled by a known method.

Embodiment 3

In the invention, a compound obtained by dispersing metal fine particles into organic solvent is used for forming a wiring pattern. The metal fine particles having an average particle diameter of 1 to 50 nm, preferably 3 to 7 nm are used. Representatively, fine particles of silver or gold are used of which surfaces are covered with dispersant such as amine, alcohol, and thiol. The organic solvent is phenol resin, epoxy resin and the like and a heat curing or light curing resin is applied. Viscosity of this compound may be controlled by adding thixotropic agent or diluent.

The organic solvent in the compound appropriately ejected on a surface by the liquid droplet ejecting head is cured by a heating process or light irradiating process. The metal fine particles contact with each other by volume shrinkage due to curing of the organic solvent, thereby welding and fusing, or agglomeration is promoted. That is, a wiring in which metal fine particles of which average particle diameter is 1 to 50 nm, more preferably 3 to 7 nm are welded, fused, or agglomerated each other is formed. In this manner, by forming a state that metal fine particles are in surface contact with each other by welding, fusing, or agglomeration, a low resistance of a wiring can be achieved.

According to the invention, by forming a wiring pattern by using such a compound, a wiring pattern having a line width of about 1 to 10 μm can be easily formed. Similarly, even when a diameter of a contact hole is about 1 to 10 μm, it can be filled with the compound. That is, a multi-layer wiring structure can be formed with a fine wiring pattern.

Note that by using fine particles of insulating substance instead of metal fine particles, an insulating pattern can be formed similarly.

Further, this embodiment can be implemented by freely combining with Embodiment Modes 1 to 3, Embodiment 1, or Embodiment 2.

Embodiment 4

By using the invention, various electronic apparatuses can be completed. Specific examples thereof are described with reference to FIGS. 15A to 15C.

Figure 15A:
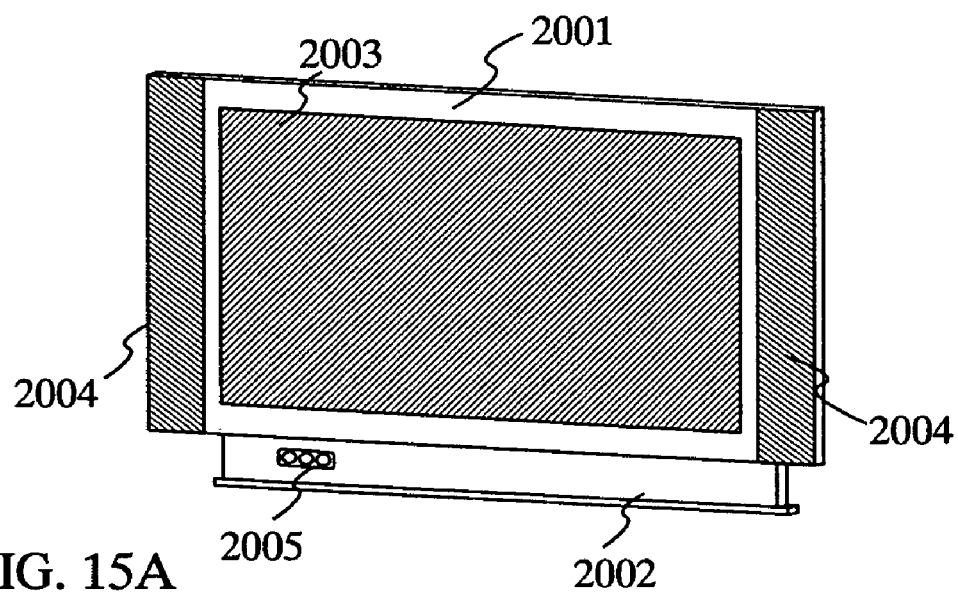
FIGS. 15A to 15C are views of electronic apparatuses according to Embodiment 3 of the invention.

FIG. 15A illustrates a display device having a large display portion of 20 to 80 inches, for example including a housing 2001, a support base 2002, a display portion 2003, speaker portions 2004, a video input terminal 2005 and the like. The invention is applied for manufacturing the display portion 2003. Such a large display device is preferably manufactured by using a large substrate of what is called a fifth generation (1000×1200 mm), a sixth generation (1400×1600 mm), and a seventh generation (1500×1800 mm) in view of the productivity and cost.

Figure 15B:
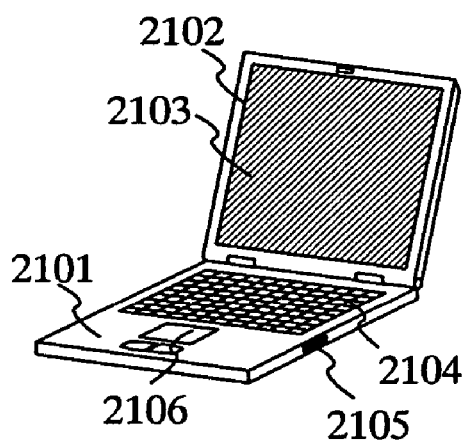

FIG. 15B illustrates a notebook type personal computer including a main body 2101, a housing 2102, a display portion 2103, a keyboard 2104, an external connecting port 2105, a pointing mouse 2106 and the like. The invention is applied for manufacturing the display portion 2103.

Figure 15C:
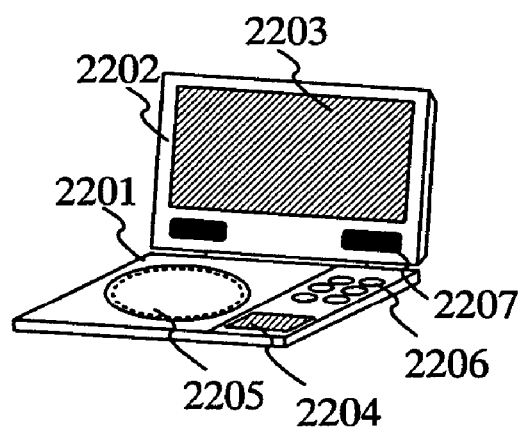

FIG. 15C illustrates a portable image reproducing apparatus provided with a recording medium (specifically a DVD reproducing apparatus), including a main body 2201, a housing 2202, a display portion A 2203, a display portion B 2204, a recording medium (DVD and the like) reading portion 2205, an operating key 2206, a speaker portion 2207 and the like. The display portion A 2203 mainly displays image data while the display portion B 2204 mainly displays text data. The invention is applied for manufacturing these display portions A and B, 2203 and 2204.

As described above, an application range of the invention is quite wide and the invention can be applied for manufacturing electronic apparatuses of various fields. Further, the aforementioned embodiment modes and embodiments can be freely combined.

INDUSTRIAL APPLICABILITY

By manufacturing a display device using the invention, efficiency of a material used for manufacturing the display device can be improved. Furthermore, simplification of a process, small scale of a device and a production line, or short time of the process can be achieved.

The invention claimed is:

1. A manufacturing method of a display device comprising:
   forming a conductive film over a substrate by ejecting liquid droplets containing conductive particles by using a first liquid droplet ejecting apparatus comprising a liquid droplet ejecting head provided with a plurality of liquid droplet ejecting nozzles arranged linearly;
   forming a resist pattern locally on the conductive film by using a second liquid droplet ejecting apparatus comprising a liquid droplet ejecting head provided with a plurality of liquid droplet ejecting nozzles arranged linearly;
   forming a wiring by etching the conductive film with the resist pattern as a mask at an atmospheric pressure or a pressure close to the atmospheric pressure by using a first plasma generating device comprising a plurality of pairs of electrodes;
   etching the resist pattern at an atmospheric pressure or a pressure close to the atmospheric pressure by using the first plasma generating device;
   forming an insulating film over the wiring; and
   forming a contact hole by etching the insulating film at an atmospheric pressure or a pressure close to the atmospheric pressure by using a second plasma generating device provided with a pair of electrodes.

2. The manufacturing method of a display device according to claim 1, wherein the wiring includes at least one conductive material selected from the group consisting of Ag, Au, Cu, Ni, Pt, Pd, Ir, Rh, W, and Al, metal sulfide of Cd and Zn, oxide of Fe, Ti, Si, Ge, Si, Zr, Ba, and the like, and fine particles or dispersible nanoparticles of silver halide.

3. The manufacturing method of a display device according to claim 1, wherein the pair of electrodes are cylindrical electrodes.

4. The manufacturing method of a display device according to claim 1, wherein the plurality of pairs of electrodes are arranged linearly.

5. The manufacturing method of a display device according to claim 1, wherein the insulating film comprising at least one selected from the group consisting of a silicon nitride, a silicon oxide and an organic resin.

6. A manufacturing method of a display device comprising:
forming a conductive film over a substrate by ejecting liquid droplets containing conductive particles by using a liquid droplet ejecting apparatus comprising a liquid droplet ejecting head provided with a plurality of liquid droplet ejecting nozzles arranged linearly;
after forming the conductive film, forming a wiring by etching an unnecessary portion of the conductive film locally at an atmospheric pressure or a pressure close to the atmospheric pressure by using a first plasma generating device comprising a plurality of pairs of electrodes;
forming an insulating film over the wiring; and
forming contact holes by etching the insulating film at an atmospheric pressure or a pressure close to the atmospheric pressure by using a second plasma generating device provided with only a pair of electrodes, the second plasma generating device moving in a direction perpendicular to a direction in which the substrate is moved.

7. The manufacturing method of a display device according to claim 6, wherein the wiring includes at least one conductive material selected from the group consisting of Ag, Au, Cu, Ni, Pt, Pd, Ir, Rh, W, and Al, metal sulfide of Cd and Zn, oxide of Fe, Ti, Si, Ge, Si, Zr, Ba, and the like, and fine particles or dispersible nanoparticles of silver halide.

8. The manufacturing method of a display device according to claim 6, wherein the pair of electrodes are cylindrical electrodes.

9. The manufacturing method of a display device according to claim 6, wherein the plurality of pairs of electrodes are arranged linearly.

10. The manufacturing method of a display device according to claim 6, wherein the insulating film comprising at least one selected from the group consisting of a silicon nitride, a silicon oxide and an organic resin.

11. The manufacturing method of a display device according to claim 6, wherein the plurality of liquid droplet ejecting nozzles of the liquid droplet ejecting head in the liquid droplet ejecting apparatus are arranged two lines without an offset in pitch.

12. A manufacturing method of a display device comprising:
forming a conductive film over a substrate by using a liquid droplet ejecting apparatus comprising a liquid droplet ejecting head provided with a plurality of liquid droplet ejecting nozzles arranged linearly;
forming a resist pattern on the conductive film;
after forming the resist pattern, forming a wiring by etching an unnecessary portion of the conductive film locally at an atmospheric pressure or a pressure close to the atmospheric pressure by using a first plasma generating device comprising a plurality of pairs of electrodes;
etching the resist pattern at an atmospheric pressure or a pressure close to the atmospheric pressure by using the first plasma generating device;
forming an insulating film over the wiring; and
forming a contact hole by etching the insulating film at an atmospheric pressure or a pressure close to the atmospheric pressure by using a second plasma generating device provided with a pair of electrodes.

13. The manufacturing method of a display device according to claim 12, wherein the wiring includes at least one conductive material selected from the group consisting of Ag, Au, Cu, Ni, Pt, Pd, Ir, Rh, W, and Al, metal sulfide of Cd and Zn, oxide of Fe, Ti, Si, Ge, Si, Zr, Ba, and the like, and fine particles or dispersible nanoparticles of silver halide.

14. The manufacturing method of a display device according to claim 12, wherein the pair of electrodes are cylindrical electrodes.

15. The manufacturing method of a display device according to claim 12, wherein the plurality of pairs of electrodes are arranged linearly.

16. The manufacturing method of a display device according to claim 12, wherein the insulating film comprising at least one selected from the group consisting of a silicon nitride, a silicon oxide and an organic resin.

* * * * *